(12) United States Patent  
Ahn

(10) Patent No.: US 12,022,627 B2
(45) Date of Patent: Jun. 25, 2024

(54) DISPLAY DEVICE

(71) Applicant: Samsung Display Co., Ltd., Yongin-si (KR)

(72) Inventor: Sungsang Ahn, Hwaseong-Si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 318 days.

(21) Appl. No.: 17/430,723

(22) PCT Filed: Jun. 28, 2019

(86) PCT No.: PCT/KR2019/007932
§ 371 (c)(1),
(2) Date: Aug. 13, 2021

(87) PCT Pub. No.: WO2020/218674
PCT Pub. Date: Oct. 29, 2020

(65) Prior Publication Data
US 2022/0167512 A1 May 26, 2022

(30) Foreign Application Priority Data
Apr. 24, 2019 (KR) .................. 10-2019-0047743

(51) Int. Cl.
H05K 5/00 (2006.01)
H05K 5/02 (2006.01)

(52) U.S. Cl.
CPC ......... *H05K 5/0217* (2013.01); *H05K 5/0017* (2013.01)

(58) Field of Classification Search
CPC .......................... H05K 5/0017; H05K 5/0217

USPC ................ 361/807, 728, 730, 731, 809, 810
See application file for complete search history.

(56) References Cited

U.S. PATENT DOCUMENTS

| | | | |
|---|---|---|---|
| 8,711,566 B2 | 4/2014 | O'Brien | |
| 9,678,539 B2 | 6/2017 | Hayk et al. | |
| 10,101,826 B2 | 10/2018 | Lindblad | |
| 10,194,543 B2 | 1/2019 | Seo et al. | |

(Continued)

FOREIGN PATENT DOCUMENTS

| | | | |
|---|---|---|---|
| CN | 102902308 A | 1/2013 | |
| CN | 106971673 A | 7/2017 | |

(Continued)

OTHER PUBLICATIONS

International Search Report—PCT/KR2019/007932 dated Jan. 21, 2020, citing references listed within.

*Primary Examiner* — Hung S. Bui
(74) *Attorney, Agent, or Firm* — CANTOR COLBURN LLP

(57) ABSTRACT

A display device includes a display module, a support part including a support plate and a plurality of support bars, and first and second cases coupled to each other. The first case accommodates the display module, the support part, and the support frame, and the second case moves in a direction that is away from or closer to the first case along a first direction. When the second case moves along the first direction away from the first case, support bars of the support bars are parallelly arranged together with the support plate at one side of the support plate, and the support frame is expanded in the first direction and supports the support bars that are arranged parallelly with the support plate.

26 Claims, 26 Drawing Sheets

(56) References Cited

U.S. PATENT DOCUMENTS

| | | | |
|---|---|---|---|
| 10,321,583 B2 | 6/2019 | Seo et al. | |
| 10,582,629 B2 | 3/2020 | Xu et al. | |
| 10,852,774 B2 | 12/2020 | Dong | |
| 2012/0314400 A1 | 12/2012 | Bohn et al. | |
| 2016/0081204 A1 | 3/2016 | Park et al. | |
| 2016/0170450 A1 | 6/2016 | Kim et al. | |
| 2018/0014417 A1 | 1/2018 | Seo et al. | |
| 2018/0077808 A1 | 3/2018 | Seo et al. | |
| 2018/0103552 A1* | 4/2018 | Seo | G06F 1/1652 |
| 2020/0022269 A1 | 1/2020 | Liao | |
| 2020/0267246 A1* | 8/2020 | Song | H05K 1/148 |
| 2021/0405703 A1* | 12/2021 | Song | G06F 1/1694 |
| 2022/0240400 A1* | 7/2022 | Zhou | G09F 9/301 |

FOREIGN PATENT DOCUMENTS

| | | |
|---|---|---|
| CN | 107919065 A | 4/2018 |
| CN | 108932908 B | 6/2019 |
| CN | 108064404 B | 6/2020 |
| JP | 2015228022 A | 12/2015 |
| KR | 101011627 | 1/2011 |
| KR | 101170476 | 8/2012 |
| KR | 101479842 | 1/2015 |
| KR | 1020160031363 | 3/2016 |
| KR | 1020160090976 | 8/2016 |
| KR | 1020160141255 | 12/2016 |
| KR | 1020170116551 A | 10/2017 |
| WO | 2018120071 | 7/2018 |

\* cited by examiner

DISPLAY DEVICE

This application is a national stage application of PCT/KR2019/007932 which claims priority under 35 U.S.C. § 119 to Korean Application No. 10-2019-0047743 filed on Apr. 24, 2019, the content of which in their entirety is herein incorporated by reference.

BACKGROUND

1. Field

Embodiments of the invention relate to a display device.

2. Description of the Related Art

In general, electronic equipment for providing an image to a user such as smartphones, digital cameras, laptop computers, navigations, and smart televisions includes a display device for displaying an image. The display device generates an image to provide the image to the user through a display screen.

In recent years, various types of display devices are being developed with a development of technology of display devices. Flexible display devices that are capable of being folded or wound are being developed, for example. The flexible display device that are variously modified in shape may be easily carried and improve user's convenience.

Among the flexible display devices, an expandable flexible display device includes a flexible display module, and the flexible display module is expanded by being drawn out from a case to the outside, as necessary. A support part is disposed under the flexible display module, and the support part supports the flexible display module.

SUMMARY

A feature of the invention is to provide a display device capable of preventing support bars supporting a display module from being deformed.

A display device in an embodiment of the invention includes a display module, a support part disposed on a surface of the display module opposite to a display surface of the display module, the support part including a support plate and a plurality of support bars, a support frame disposed under the support part and overlapping a portion of the support part, a first case which accommodates the display module, the support part, and the support frame, and a second case coupled to the first case such that the second case moves in a direction that is away from or closer to the first case along a first direction. When the second case moves along the first direction away from the first case, support bars of the plurality of support bars are arranged parallelly with the support plate at one side of the support plate, and the support frame is expanded in the first direction and supports the support bars that are arranged parallelly with the support plate.

A display device in an embodiment of the invention includes a display module, a support part disposed on a surface of the display module opposite to a display surface of the display module, the support part including a support plate and a plurality of support bars, a first case which accommodates the display module and the support part, a second case coupled to move in a direction that is away from or closer to the first case along a first direction, a first support frame disposed under the support plate, extending in a second direction crossing the first direction, and connected to the first case, a second support frame extending in the second direction, spaced apart from the first support frame in the first direction, and connected to the support plate, and a third support frame disposed between the first support frame and the second support frame. One end of the third support frame is rotatably connected to a portion of the first support frame, and another end of the third support frame is inserted into a first opening defined in the second support frame and extends in the second direction such that the another end of the third support frame moves along the first opening.

According to the embodiment of the invention, in the expansion mode of the display device, in which the exposed surface of the display module is expanded, the support frame may be disposed under the support bars supporting the display module to support the support bars, thereby preventing the support bars from being deformed due to the external force.

BRIEF DESCRIPTION OF THE DRAWINGS

The above and other exempt embodiments, advantages and features of this disclosure will become more apparent by describing in further detail exemplary embodiments thereof with reference to the accompanying drawings.

DETAILED DESCRIPTION

Figure 1:
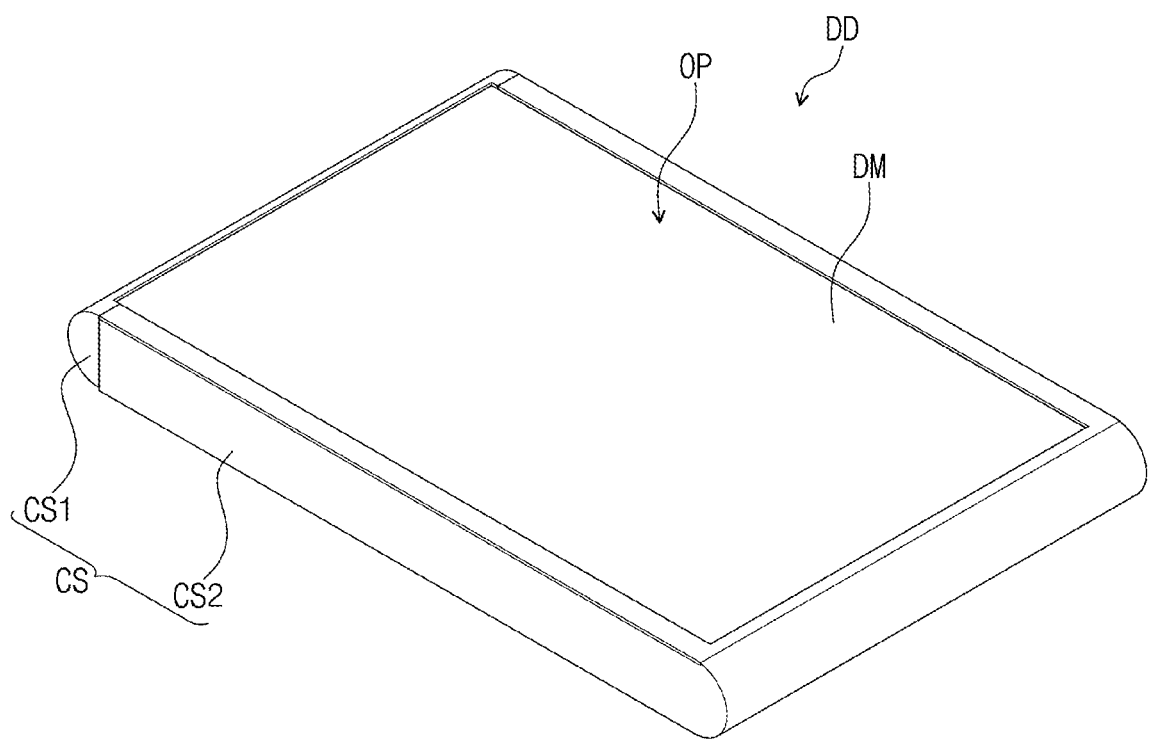
FIG. 1 is a perspective view of an embodiment of a display device according to the invention.

In this specification, it will also be understood that when one component (or area, layer, portion) is referred to as being "on", "connected to", or "coupled to" another component, it can be directly disposed/connected/coupled on/to the one component, or an intervening third component may also be present.

Like reference numerals refer to like elements throughout. Also, in the drawing figures, the thickness, ratio, and dimensions of components are exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in an embodiment can be referred to as a second element in another embodiment without departing from the scope of the appended claims. The terms of a singular form may include plural forms unless referred to the contrary.

Also, "under", "below", "above", "upper", and the like are used for explaining relation association of components illustrated in the drawings. The terms may be a relative concept and described based on directions expressed in the drawings.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by a person of ordinary skill in the art to which this invention belongs. Also, terms such as defined terms in commonly used dictionaries are to be interpreted as having meanings consistent with meaning in the context of the relevant art and are expressly defined herein unless interpreted in an ideal or overly formal sense.

The meaning of "include" or "comprise" specifies a property, a fixed number, a step, an operation, an element, a component or a combination thereof, but does not exclude other properties, fixed numbers, steps, operations, elements, components or combinations thereof.

Hereinafter, embodiments of the invention will be described in detail with reference to the accompanying drawings.

Figure 2:
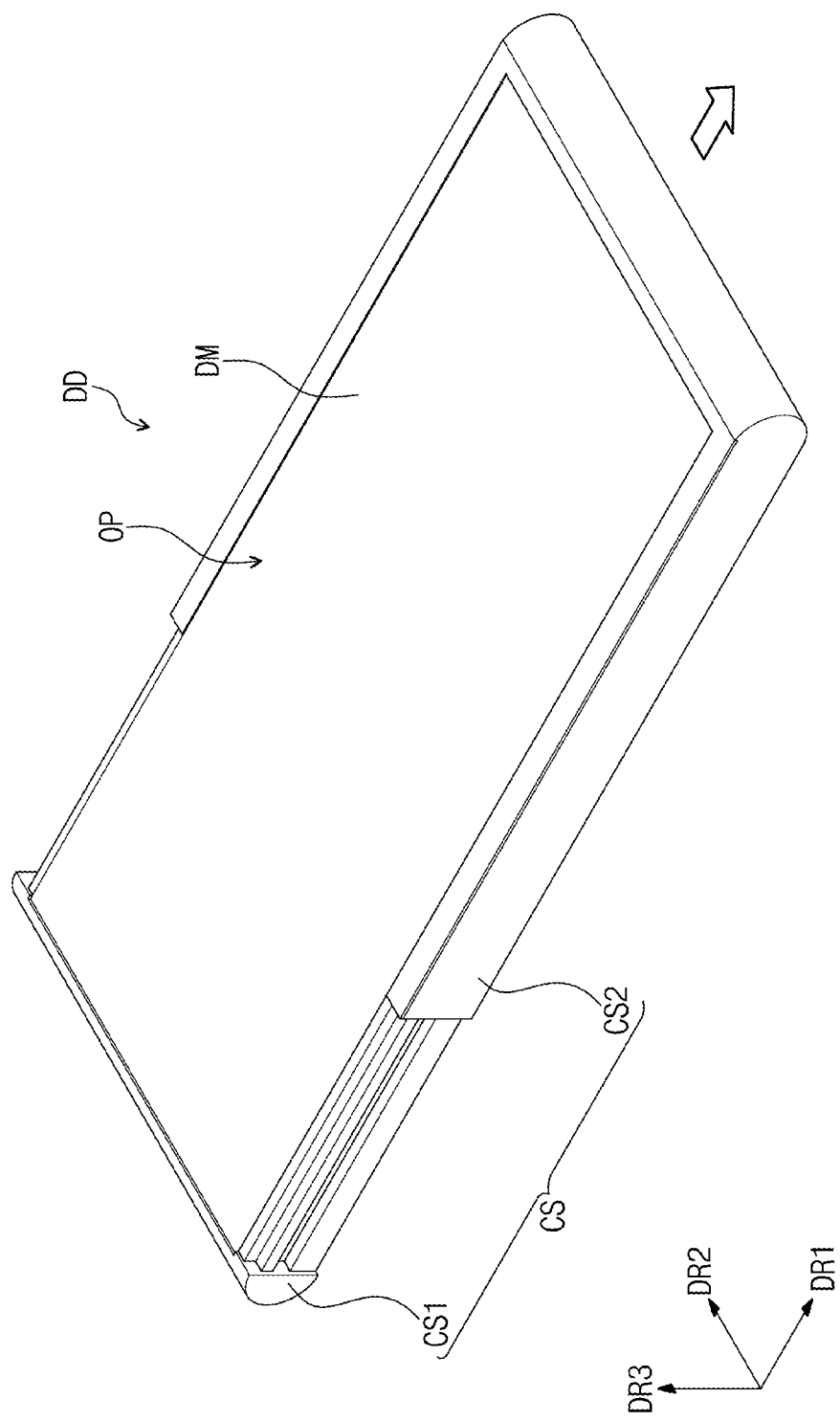
FIG. 2 is a view for explaining an expansion mode of the display device illustrated in FIG. 1.

FIG. 1 is a perspective view of an embodiment of a display device according to the invention. FIG. 2 is a view for explaining an expansion mode of the display device illustrated in FIG. 1.

Referring to FIG. 1, a display device DD in an embodiment of the invention may include a display module DM and a case CS in which the display module DM is accommodated. The display module DM may be exposed to the outside through an opening OP defined in an upper portion of the case CS.

The case CS may include a first case CS1 and a second case CS2 coupled to the first case CS1 to move in a first direction DR1. The first case CS1 and the second case CS2 may be coupled to each other to accommodate the display module DM.

Hereinafter, a direction crossing the first direction DR1 is defined as a second direction DR2. A direction substantially perpendicularly crossing a plane defined by the first and second directions DR1 and DR2 is defined as a third direction DR3. In this specification, the term "viewed from the plane" may mean a state viewed from the third direction D3.

A more detailed configuration of the first and second cases CS1 and CS2 will be described in detail below with reference to FIGS. 7 to 10.

Referring to FIGS. 1 and 2, the second case CS2 may move in a direction that is away from or close to the first case CS1 along the first direction DR1. When the second case CS2 moves in the first direction DR1, an area of an exposed surface of the display module DM may be adjusted according to the movement of the second case CS2. As the second case CS2 moves, both the normal mode and the expansion mode of the display device DD may be implemented.

In an embodiment, the display module DM may be a flexible display module and may be supported by a support part (hereinafter, illustrated in FIG. 13) disposed under the display module DM, for example. The support part may be connected to the second case CS2, and when the second case CS2 moves in a direction that is away from the first case CS1 along the first direction DR1, the support part may also move in the direction that is away from the first direction DR1 along the first direction DR1.

Although not shown, a portion of the display module DM, which is not exposed to the outside, may be disposed in the first case CS1 in addition to the portion of the display module DM, which is exposed through the opening OP. The display module DM disposed on the support part may move together with the support part in the first direction DR1 as the second case CS2 moves, and as a result, the exposed surface of the display module DM may be expanded. As the exposed surface of the display module DM is expanded, a user may visually recognize an image through a larger screen. The state of the display device DD, in which the exposed surface of the display module DM is expanded, may be defined as the expansion mode.

As illustrated in FIG. 1, in a state in which the first case CS1 and the second case CS2 are coupled to be adjacent to each other, the exposed surface of the display module DM may be set to be minimized. In an embodiment, the second case CS2 may move in a direction closer to the first case CS1 along the first direction DR1, and as illustrated in FIG. 1, the first case CS1 and the second case CS2 may be disposed adjacent to each other. This state of the display device DD may be defined as the normal mode, for example.

Figure 3:
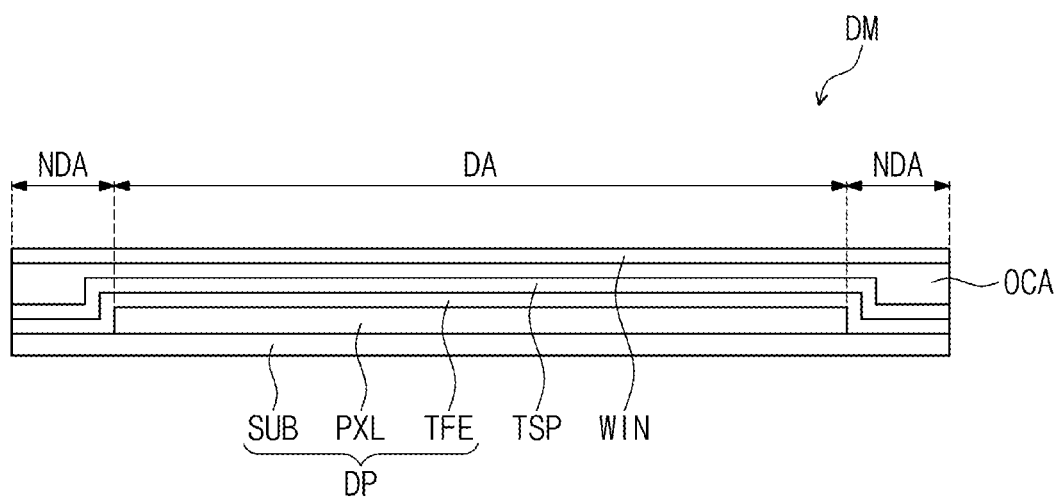
FIG. 3 is a schematic cross-sectional view of a display module illustrated in FIG. 1.

FIG. 3 is a schematic cross-sectional view of the display module of FIG. 1.

Referring to FIG. 3, the display module DM may include a display panel DP, a touch sensing part TSP disposed on the display panel DP, a window WIN disposed on the touch sensing part TSP, and an adhesive OCA disposed between the touch sensing part TSP and the window WIN.

In an embodiment of the invention, the display panel DP may be an emission-type display panel. However, the invention is not limited thereto. In an embodiment, various display panels, which are capable of displaying images, such as a liquid crystal display panel, electrowetting display panel, and an electrophoretic display panel may be used as the display panel DP, for example.

The display panel DP in an embodiment of the invention may be an emission-type display panel, but is not limited thereto. In an embodiment, the display panel DP may be an organic light emitting display panel or a quantum dot light emitting display panel, for example. An emission layer of the organic light emitting display panel may include an organic light emitting material. A light emitting layer of the quantum dot light emitting display panel may include a quantum dot, a quantum rod, or the like. Hereinafter, the display panel DP will be described as the organic light emitting display panel.

The display panel DP may be a flexible display panel. The display panel DP may include a substrate SUB, a pixel layer PXL disposed on the substrate SUB, and a thin film encapsulation layer TFE disposed on the substrate SUB to cover the pixel layer PXL. The substrate SUB may be a transparent substrate and include a flexible plastic substrate. In an embodiment, the substrate SUB may include polyimide ("PI"), for example.

The substrate SUB may include a display area DA and a non-display area NDA around the display area DA. The pixel layer PXL may be disposed on the display area DA. The pixel layer PXL may include a plurality of pixels, and each of the pixels may include a light emitting element.

The thin film encapsulation layer TFE may include at least two inorganic layers and an organic layer disposed between the at least two inorganic layers. The inorganic layers may include an inorganic material and protect the pixel layer PXL against moisture/oxygen. The organic layer may include an organic material and protect the pixel layer PXL against foreign substances such as dust particles.

The touch sensing part TSP may be disposed on the thin film encapsulation layer TFE. The touch sensing part TSP may sense an external input (user's hand, touch pen, or the like) to change the external input into a predetermined input signal. The touch sensing part TSP may include a plurality of sensing electrodes to sense the external input. The sensing electrodes may sense the external input in a capacitive manner.

The touch sensing part TSP may be directly manufactured on the thin film encapsulation layer TFE when the display module DM is manufactured. However, the invention is not limited thereto. In an embodiment, the touch sensing part TSP may be manufactured as a touch panel that is separated from the display panel DP and then attached to the display panel DP by an adhesive, for example.

The window WIN may protect the display panel DP and the touch sensing part TSP against external scratch and impact. The window WIN may be attached to the touch sensing part TSP by the adhesive OCA. The adhesive OCA may include an optical clear adhesive. An image generated in the display panel DP may pass through the window WIN and then be provided to the user.

Figure 4:
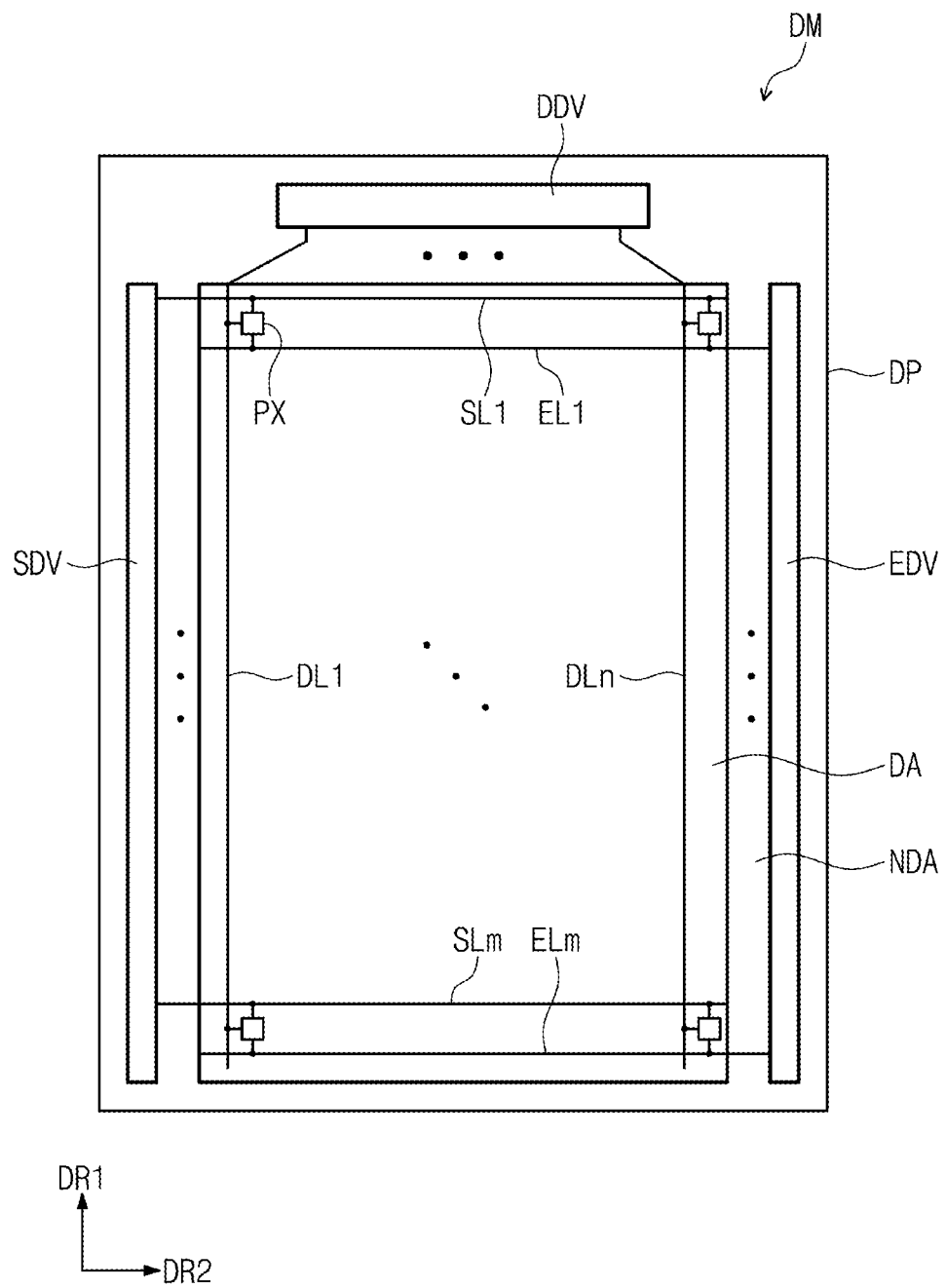
FIG. 4 is a plan view of the display module illustrated in FIG. 3.

FIG. 4 is a plan view of the display module of FIG. 3;

Referring to FIG. 4, the display module DM may include a display panel DP, a scan driver SDV, a data driver DDV, and an emission driver EDV. Although a planar shape of the display panel DP is exemplified in FIG. 4, a planar shape of the touch sensing part TSP is omitted.

The display panel DP may have a quadrangular (e.g., rectangular) shape having long sides in the first direction DR1 and short sides in the second direction DR2. The display panel DP may have a plane defined by the first and second directions DR1 and DR2. The display panel DP may include a display area DA and a non-display area NDA surrounding the display area DA.

The display panel DP may include a plurality of pixels PX, a plurality of scan lines SL1 to SLm, a plurality of data lines DL1 to DLn, and a plurality of emission lines EL1 to ELm. Here, m and n are natural numbers. The pixels PX may be disposed on the display area DA and connected to the scan lines SL1 to SLm, the data lines DL1 to DLn, and the emission lines EL1 to ELm.

The scan driver SDV, the data driver DDV, and the emission driver EDV may be disposed on the non-display area NDA. The scan driver SDV may be disposed on the non-display area NDA adjacent to one side (e.g., left side in FIG. 4) of the display panel DP defined as one of the long sides of the display panel DP.

The emission driver EDV may be disposed on the non-display area NDA adjacent to the other side (e.g., right side in FIG. 4) of the display panel DP, which is defined as a side opposite to the one side of the display panel DP. The data driver DDV may be manufactured in the form of an integrated circuit chip and disposed on the non-display area NDA that is adjacent to any one short side of the short sides of the display panel DP.

The scan lines SL1 to SLm may extend in the second direction DR2 and be connected to the scan driver SDV. The data lines DL1 to DLn may extend in the first direction DR1 and be connected to the data driver DDV. The emission lines EL1 to ELm may extend in the second direction DR2 and be connected to an emission driver EDV.

The scan driver SDV may generate a plurality of scan signals, and the scan signals may be applied to the pixels PX through the scan lines SL1 to SLm. The scan signals may be sequentially applied to the pixel PX. The data driver DDV may generate a plurality of data voltages, and the data voltages may be applied to the pixels PX through the data lines DL1 to DLn. The emission driver EDV may generate a plurality of emission signals, and the emission signals may be applied to the pixels PX through the emission lines EL1 to ELm.

Although not shown, the display module DM may include a timing controller (not shown) that controls operations of the scan driver SDV, the data driver DDV, and the emission driver EDV.

The pixels PX may receive the data voltages in response to the scan signals. The pixels PX may emit light having luminance corresponding the data voltages in response to the emission signals to display an image. An emission time of the pixels PX may be controlled by the emission signals.

Figure 5:
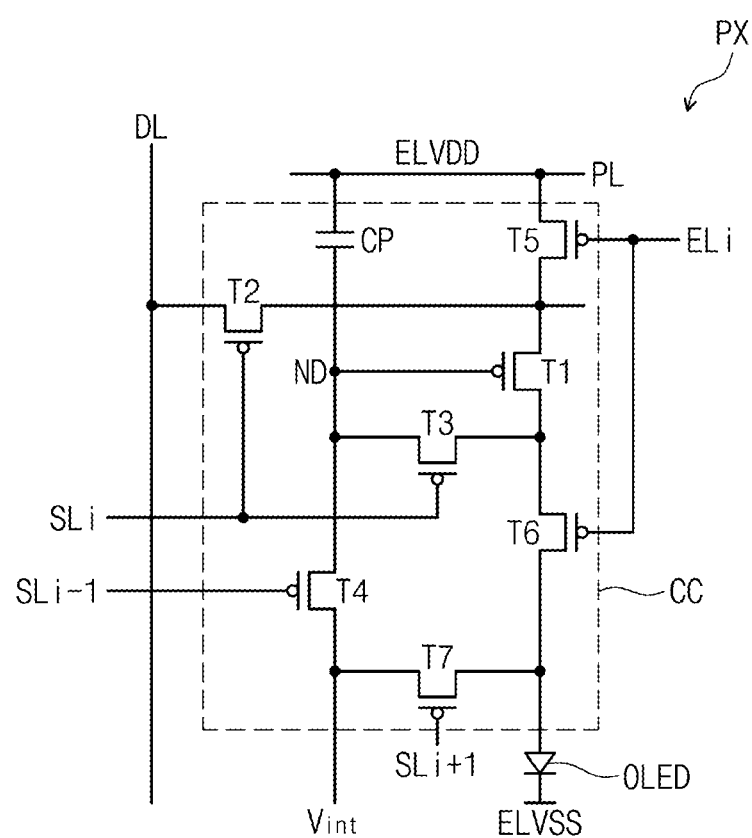
FIG. 5 is a view illustrating an embodiment of an equivalent circuit of any one pixel illustrated in FIG. 4.

FIG. 5 is a view illustrating an embodiment of an equivalent circuit of any one pixel illustrated in FIG. 4.

Referring to FIG. 5, the pixel PX may include an organic light emitting element OLED and a pixel circuit CC. The pixel circuit CC may include a plurality of transistors T1 to T7 and a capacitor CP. The pixel circuit CC may control an amount of current flowing to the organic light emitting element OLED to correspond to a data voltage.

The organic light emitting element OLED may emit light having predetermined luminance corresponding to the amount of current supplied from the pixel circuit CC. For this, a first voltage ELVDD may be set to a level greater than that of the second voltage ELVSS.

Each of the transistors T1 to T7 may include an input electrode (or a source electrode), an output electrode (or a drain electrode), and a control electrode (or a gate electrode). In this specification, for convenience, either the input electrode or the output electrode may be also referred to as a first electrode and the other may be also referred to as a second electrode.

The first electrode of the first transistor T1 may be connected to the first voltage ELVDD via the fifth transistor T5, and the second electrode may be connected to an anode electrode the organic light emitting element OLED via the sixth transistor T6. The first transistor T1 may be referred to as a driving transistor in this specification. The first transistor T1 may control an amount of current flowing to the organic light emitting element OLED according to the voltage applied to the control electrode of the first transistor T1.

The second transistor T2 may be connected between the data line DL and the first electrode of the first transistor T1, and the control electrode of the second transistor T2 may be connected to an i-th scan line SLi. The second transistor T2 may be turned on when an i-th scan signal Si is provided to the i-th scan line SLi to electrically connect the data line DL to the first electrode of the first transistor T1.

The third transistor T3 may be connected between the second electrode and the control electrode of the first transistor T1. The control electrode of the third transistor T3 may be connected to the i-th scan line SLi. The third transistor T3 may be turned on when the i-th scan signal Si is provided to the i-th scan line SLi to electrically connect the second electrode and the control electrode of the first transistor T1 to each other. When the third transistor T3 is turned on, the first transistor T1 may be connected in the form of a diode.

The fourth transistor T4 is connected between a node ND and an initialization power generator (not shown). The control electrode of the fourth transistor T4 may be connected to an (i−1)-th scan line SLi'1. The fourth transistor T4 may turned on when an (i−1)-th scan signal is provided to an (i−1)-th scan line SLi−1 to provide an initialization voltage Vint to the node ND.

The fifth transistor T5 may be connected between the power line PL and the first electrode of the first transistor T1. The control electrode of the fifth transistor T5 may be connected to an i-th emission line ELi.

The sixth transistor T6 may be connected between the second electrode of the first transistor T1 and the anode electrode of the organic light emitting element OLED. The control electrode of the sixth transistor T6 may be connected to the i-th emission line ELi.

The seventh transistor T7 may be connected between the initialization power generator (not shown) and the anode electrode of the organic light emitting element OLED. The control electrode of the seventh transistor T7 is connected to an (i+1)-th scan line SLi+1. The seventh transistor T7 may be turned on when an (i+1)-th scan signal is provided to an (i+1)-th scan line SLi+1 to provide the initialization voltage Vint to the anode electrode of the organic light emitting element OLED.

The seventh transistor T7 may improve black display capability of the pixel PX. When the seventh transistor T7 is turned on, a parasitic capacitor (not shown) of the organic light emitting element OLED may be discharged. In this case, when black luminance is implemented, the organic light emitting element OLED may not emit light due to leakage current from the first transistor T1, and thus, black display performance may be improved.

Although a p-channel metal-oxide-semiconductor ("PMOS") is fundamentally illustrated in FIG. 5, the invention is not limited thereto. In an embodiment, the pixel PX may be constituted by an n-channel metal-oxide-semiconductor ("NMOS") or a combination of the NMOS and the PMOS, for example.

The capacitor CP may be disposed between the power line PL and the node ND. The capacitor CP may store the data voltage. When the fifth transistor T5 and the sixth transistor T6 are turned on according to the voltage stored in the capacitor CP, an amount of current flowing through the first transistor T1 may be determined.

Figure 6:
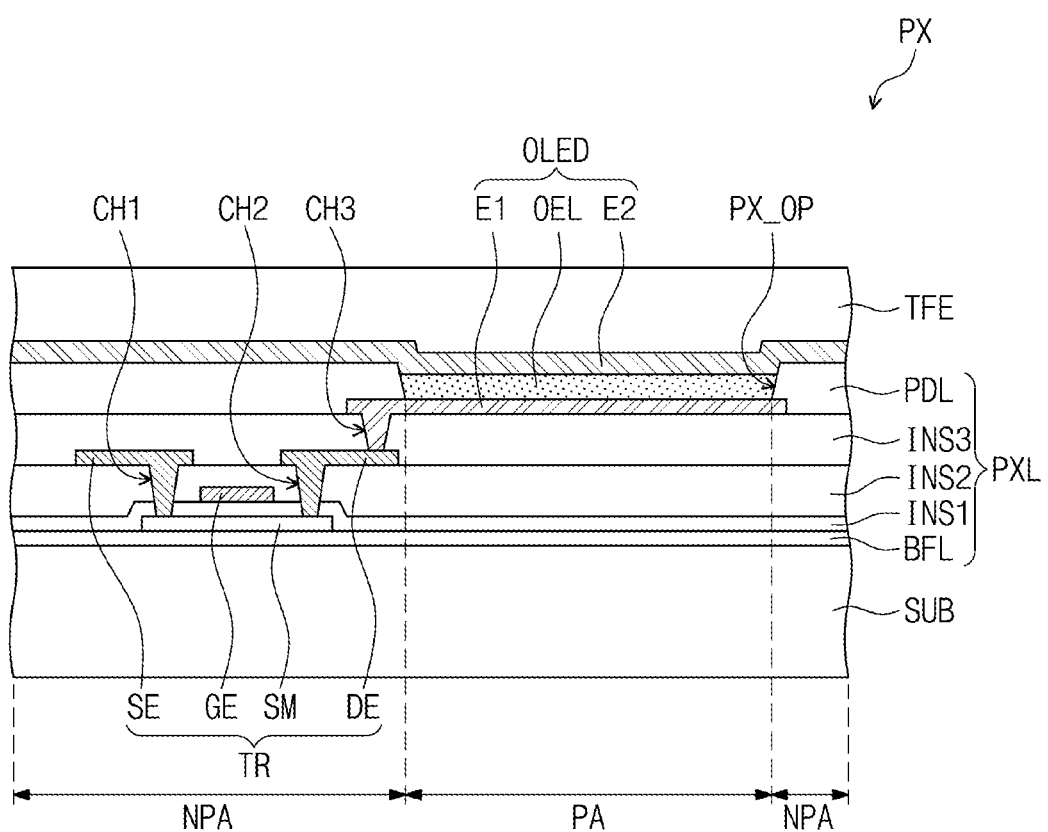
FIG. 6 is a cross-sectional view of a portion corresponding to a light emitting element illustrated in FIG. 5.

FIG. 6 is a cross-sectional view of a portion corresponding to the light emitting element of FIG. 5.

Referring to FIG. 6, the pixel PX may include the organic light emitting element OLED and the transistor TR connected to the organic light emitting element OLED. The organic light emitting element OLED may include a first electrode E1, a second electrode E2, and an organic emission layer OEL disposed between the first electrode E1 and the second electrode E2. The transistor TR may be the sixth transistor T6 illustrated in FIG. 5.

The first electrode E1 may be an anode electrode, and the second electrode E2 may be a cathode electrode. The first electrode E1 may be defined as a pixel electrode, and the second electrode E2 may be defined as a common electrode.

The pixel PX may be divided into a pixel area PA and a non-pixel area NPA around the pixel area PA. The organic light emitting element OLED may be disposed on the pixel area PA, and the transistor TR may be disposed on the non-pixel area NPA.

The transistor TR and the organic light emitting element OLED may be disposed on the substrate SUB. A buffer layer BFL may be disposed on the substrate SUB, and the buffer layer BFL may include an inorganic material. The semiconductor layer SM of the transistor TR may be disposed on the buffer layer BFL. The semiconductor layer SM may include a semiconductor including or consisting of an inorganic material such as amorphous silicon or polycrystalline silicon, or an organic semiconductor. Also, the semiconductor layer SM may include an oxide semiconductor.

Although not shown in FIG. 6, the semiconductor layer SM may include a source region, a drain region, and a channel region between the source region and the drain region.

A first insulation layer INS1 may be disposed on the buffer layer BFL to cover the semiconductor layer SM. The first insulation layer INS1 may include an inorganic material. A gate electrode GE of the transistor TR overlapping the semiconductor layer SM may be disposed on the first insulation layer INS1. The gate electrode GE may be disposed to overlap the channel region of the semiconductor layer SM.

A second insulation layer INS2 may be disposed on the first insulation layer INS1 to cover the gate electrode GE. The second insulation layer INS2 may be defined as an interlayer dielectric. The second insulation layer INS2 may include an organic material and/or an inorganic material.

The source electrode SE and the drain electrode DE of the transistor TR may be disposed to be spaced apart from each other on the second insulation layer INS2. The source electrode SE may be connected to the source region of the semiconductor layer SM through a first contact hole CH1 that is defined to pass through the first and second insulation layers INS1 and INS2. The drain electrode DE may be connected to the drain region of the semiconductor layer SM through a second contact hole CH2 that is defined to pass through the first and second insulation layers INS1 and INS2.

A third insulation layer INS3 may be disposed on the second insulation layer INS2 to cover the source and drain electrodes SE and DE of the transistor TR. The third insulation layer INS3 may be defined as a planarization layer that provides a flat top surface and include an organic material.

The first electrode E1 may be disposed on the third insulation layer INS3. The first electrode E1 may be connected to the drain electrode DE of the transistor TR through a third contact hole CH3 that is defined to pass through the third insulation layer INS3.

A pixel defining layer PDL through which a predetermined area of the first electrode E1 is exposed may be disposed on the first electrode E1 and the third insulation layer INS3. An opening PX_OP through which a predetermined portion of the first electrode E1 is exposed may be defined in the pixel defining layer PDL.

An organic emission layer OEL may be disposed on the first electrode E1 within the opening PX_OP. The organic emission layer OEL may emit one of red light, green light, and blue light. However, the invention is not limited thereto. In an embodiment, the organic emission layer OEL may generate white light by combination of organic materials that respectively generate red, green, and blue light, for example.

The second electrode may be disposed on the pixel defining layer PDL and the organic light emitting layer OEL. The thin film encapsulation layer TFE may be disposed on the organic light emitting element OLED to cover the pixel PX. A layer between the substrate SUB and the thin film encapsulation layer TFE may be defined as the pixel layer PXL.

The first voltage ELVDD may be applied to the first electrode E1, and the second voltage ELVSS may be applied to the second electrode E2. Holes and electrons injected into the organic emission layer OEL may be coupled to each other to form exciton. While the exciton may be transitioned to a ground state, the organic light emitting element OLED may emit light. The organic light emitting element OLED may emit red, green, or blue light according to a flow of current to display an image.

FIGS. 7 to 12 are exploded perspective views of the case illustrated in FIG. 1.

Figure 7:
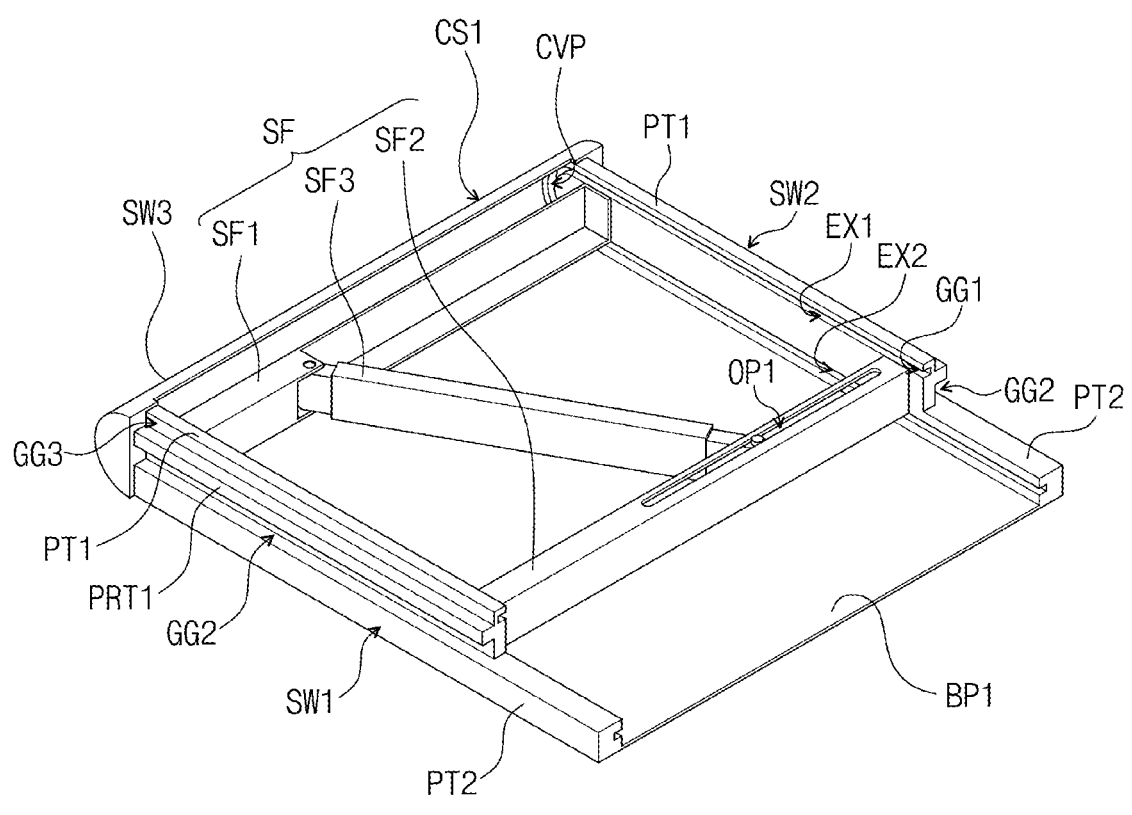
FIG. 7 is a perspective view of a first case illustrated in FIG. 1.
Figure 7:
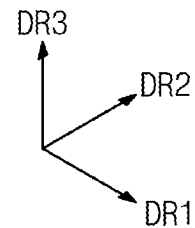
Figure 8:
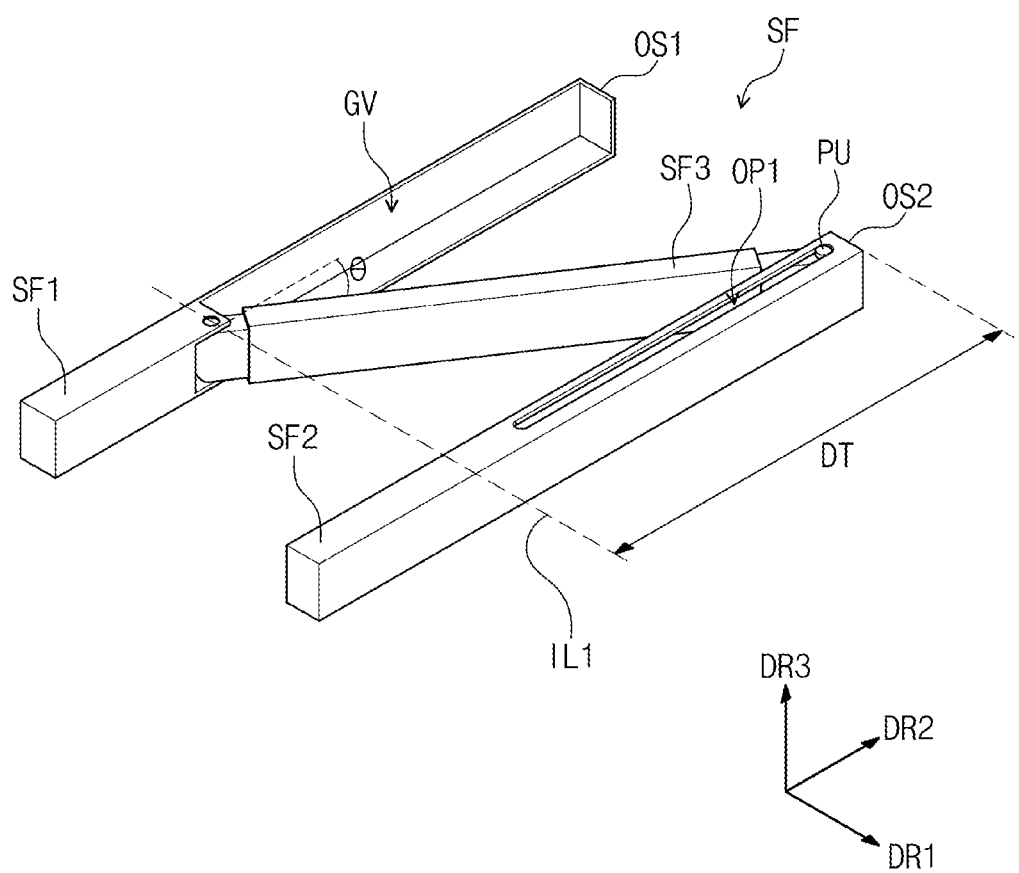
FIGS. 8 and 9 are perspective views of a support frame illustrated in FIG. 7.
Figure 9:
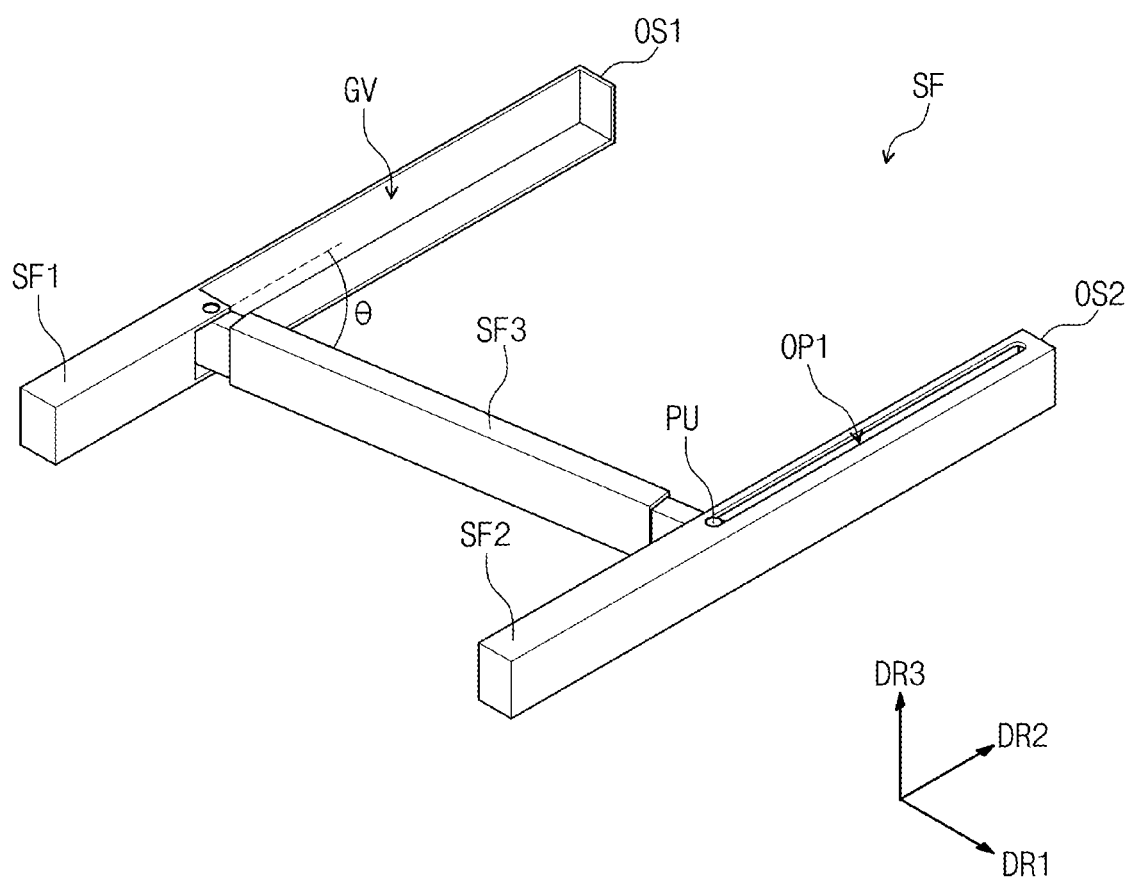
Figure 10:
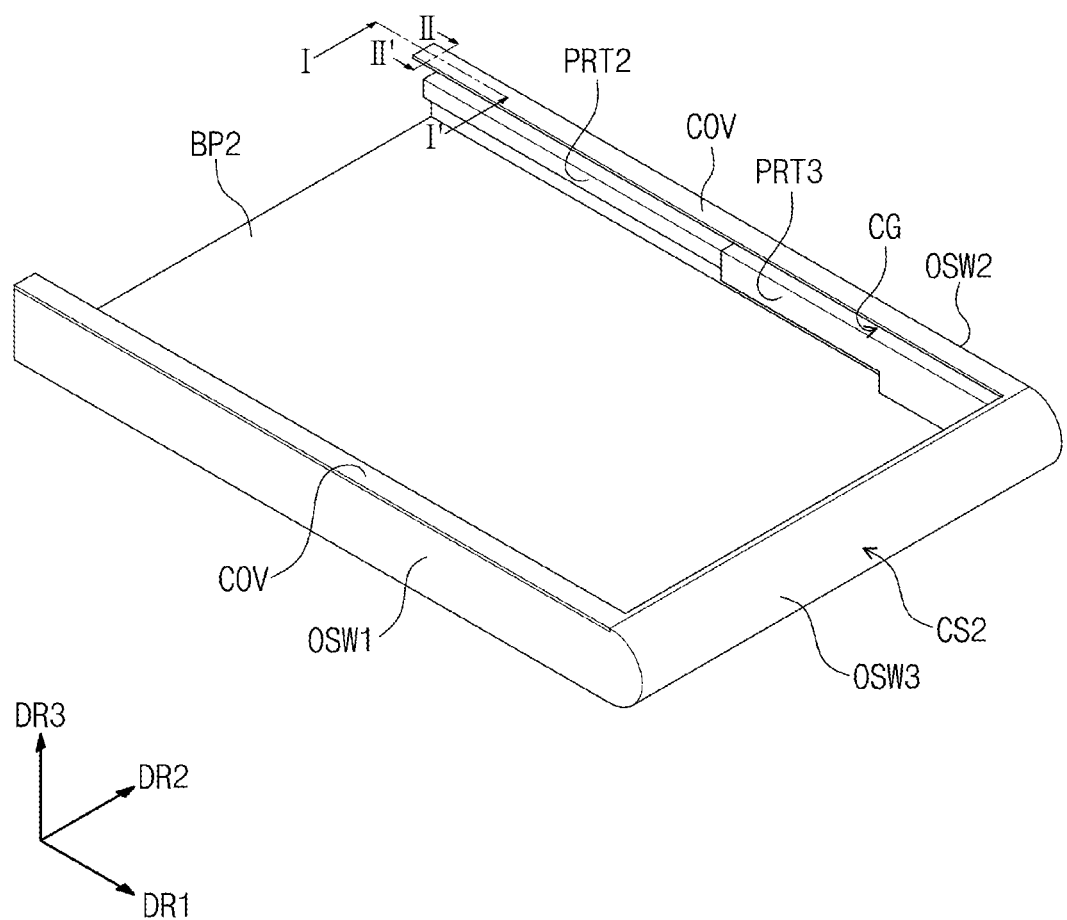
FIG. 10 is a perspective view of a second case illustrated in FIG. 1.
Figure 11:
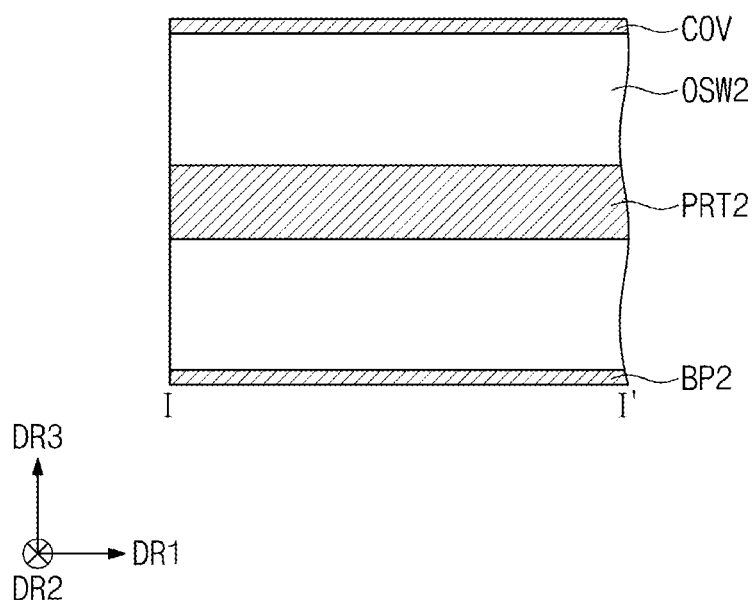
FIG. 11 is a cross-sectional view taken along line I-I' illustrated in FIG. 10.
Figure 12:
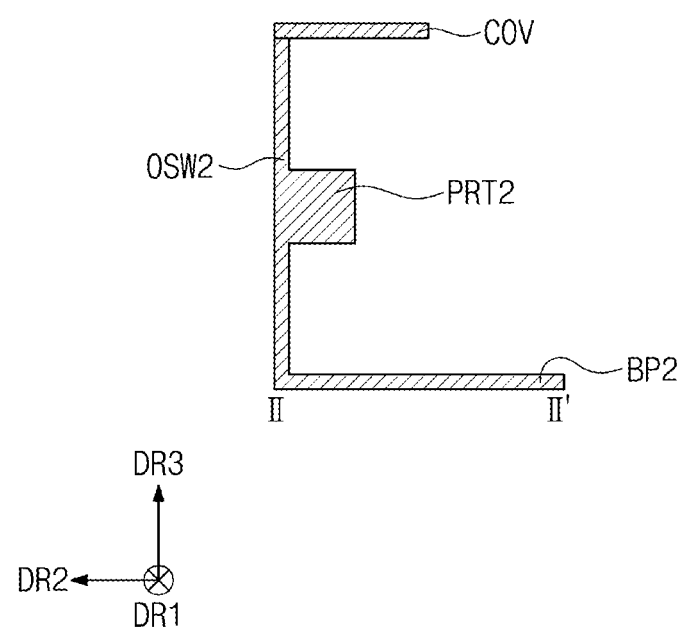
FIG. 12 is a cross-sectional view taken along line II-II' illustrated in FIG. 10.

Particularly, FIG. 7 is a perspective view of the first case illustrated in FIG. 1, FIGS. 8 and 9 are perspective views of a support frame illustrated in FIG. 7, and FIG. 10 is a perspective view of the second case illustrated in FIG. 1. FIG. 11 is a cross-sectional view taken along line I-I' illustrated in FIG. 10. FIG. 12 is a cross-sectional view taken along line II-II' of FIG. 10.

Referring to FIGS. 7 to 10, the case CS (refer to FIGS. 1 and 2) may include a first case CS1, a support frame SF disposed in the first case CS1, and a second case CS2 coupled to the first case CS1.

Referring to FIG. 7, the first case CS1 may include a first sidewall SW1, a second sidewall SW2, a third sidewall SW3, and a first bottom part BP1. The first sidewall SW1 and the second sidewall SW2 may extend in the first direction DR1. The second sidewall SW2 may face the first sidewall SW1 in the second direction DR2. The first sidewall SW1 and the second sidewall SW2 may have substantially the same shape as each other.

A first guide groove GG1 may be defined in each of an inner side surface of the first sidewall SW1 and an inner side surface of the second sidewall SW2, which face each other. The inner side surfaces of the first and second sidewalls SW1 and SW2 may define inner side surfaces of the first case CS1, which face each other in the second direction DR2.

The first guide groove GG1 defined on the inner side surface of the first sidewall SW1 is illustrated in the perspective view of FIG. 7, but the first guide groove GG1 may be also defined in the inner side surface of the second sidewall SW2.

The first guide groove GG1 may include a first extension part EX1, a second extension part EX2, and a curved part CVP. The first extension part EX1 may extend in the first direction DR1. The second extension part EX2 may extend in the first direction DR1 and may be disposed under the first extension part EX1.

In an embodiment, although a length of the second extension part EX2 in the first direction DR1 is longer than that of the first extension part EX1, for example, a relationship between the length of the second extension part EX2 and the length of the first extension part EX1 is not limited thereto.

The curved part CVP may extend in a curved shape from one end of the first extension part EX1 to one end of the second extension part EX2. The curved part CVP may be adjacent to one side of the first case CS1 among both opposite sides of the first case CS1, which are opposite to each other in the first direction DR1.

One end of the first extension part EX1 and one end of the second extension part EX2 may be adjacent to one side of the first case CS1. The curved part CVP may have a curved shape that is convex toward one side of the first case CS1.

The third sidewall SW3 may define one side of the first case CS1. The third sidewall SW3 may extend in the second direction DR2 and may be disposed between one side of the first sidewall SW1 and one side of the second sidewall SW2. An outer surface of the third sidewall SW3 may have a curved shape that is convex toward the outside. An inner surface of the third sidewall SW3, which is a surface opposite to the outer surface of the third sidewall SW3, may have a concavely curved shape.

The first bottom part BP1 may have a plane defined by the first and second directions DR1 and DR2. The first bottom part BP1 may extend from a lower end of the first sidewall SW1, a lower end of the second sidewall SW2, and a lower end of the third sidewall SW3.

Each of the first sidewall SW1 and the second sidewall SW2 may include a first portion PT1, a second portion PT2, and a first protrusion PRT1. An inner side surface of each of the first and second sidewalls SW1 and SW2 may be an inner side surface of each of the first portion PT1 and the second portion PT2. An outer side surface of each of the first and second sidewalls SW1 and SW2, which is a surface opposite to the inner side surface of each of the first and second sidewalls SW1 and SW2, may be an outer side surface of each of the first portion PT1 and the second portion PT2.

The first protrusion PRT1 may protrude from each of the outer side surface of the first sidewall SW1 and the outer side surface of the second sidewall SW2 to extend in the first direction DR1. A second guide groove GG2 may be defined under the first protrusion PRT1.

The first portion PT1 may be adjacent to the third sidewall SW3 to extend in the first direction DR1. The second portion PT2 may extend from a lower portion of the first portion PT1 in the first direction DR1.

The first protrusion PRT1 may protrude from an outer side surface of the first portion PT1. The first protrusion PRT1 may extend in the first direction DR1. The second guide groove GG2 extending in the first direction DR1 may be defined on each of the outer side surface of the first sidewall SW1 and the outer side surface of the second sidewall SW2. The second guide groove GG2 may be disposed under the first protrusion PRT1.

An upper end of the first portion PT1 may be disposed higher than the first protrusion PRT1. A third guide groove GG3 extending in the first direction DR1 may be defined between a portion of the first portion PT1, which is disposed higher than the first protrusion PRT1, and the first protrusion PRT1.

The support frame SF may be disposed between the first sidewall SW1 and the second sidewall SW2. The support frame SF may be adjacent to the third sidewall SW3. The support frame SF may be disposed between the first extension part EX1 and the second extension part EX2. The support frame SF may be adjacent to the curved part CVP.

Referring to FIGS. 7 and 8, the support frame SF may include a first support frame SF1, a second support frame SF2, and a third support frame SF3. The first support frame SF1 may extend in the second direction DR2 and be connected to the first case CS1. Particularly, the first support frame SF1 may be adjacent to the curved part CVP and be connected and fixed to the first sidewall SW1 and the second sidewall SW2.

The second support frame SF2 may extend in the second direction DR2 and be spaced apart from the first support frame SF1 in the first direction DR1. The second support frame SF2 may not be connected to the first sidewall SW1 and the second sidewall SW2, but be connected to a support plate to be described below. The above-described constitutions will be described in detail with reference to FIGS. 15 and 16.

The third support frame SF3 may be disposed between the first support frame SF1 and the second support frame SF2. One end of the third support frame SF3 may be rotatably connected to a portion of the first support frame SF1.

A groove GV may be defined from a portion of the first support frame SF1, to which one end of the third support frame SF3 is connected, to one side OS1 of the first support frame SF1. The groove GV may extend in the second direction DR2. Since the groove GV is defined in the first support frame SF1, one end of the third support frame SF3 may easily rotate at the portion of the first support frame SF1.

The other end of the third support frame SF3, which is opposite the one end of the third support frame SF3, may be connected to the second support frame SF2 to move in the second direction DR2 along the second support frame SF2. A first opening OP1 extending in the second direction DR2 may be defined in the second support frame SF2. The other end of the third support frame SF3 may be inserted into the first opening OP1 to move in the second direction DR2 along the first opening OP1.

The first support frame SF1 may extend to define an angle greater than about 0 degrees and less than about 90 degrees with the third support frame SF3. More preferably, an angle θ defined by the first support frame SF1 and the third support frame SF3 may be greater than about 20 degrees and less than about 80 degrees.

The other end of the third support frame SF3 may include a protrusion unit PU that protrudes in the third direction DR3 and is inserted into the first opening OP1. The protrusion unit PU may move in the second direction DR2 along the first opening OP1. When the protrusion unit PU moves along the first opening OP1, a distance between the first support frame SF1 and the second support frame SF2 may vary.

In an embodiment, as illustrated in FIG. 8, the protrusion unit PU may move toward one side OS2 of the second support frame SF2 along the first opening OP1, for example. An angle θ defined between the first support frame SF1 and the third support frame SF3 may decrease, and a gap between the first support frame SF1 and the second support frame SF2 may decrease. The protrusion unit PU may be disposed adjacent to the one side OS2 of the second support frame SF2.

As illustrated in FIG. 9, the protrusion unit PU may move along the first opening OP1 in a direction that is away from the one side OS2 of the second support frame SF2. In this case, the angle θ defined by the first support frame SF1 and the third support frame SF3 may increase, and the gap between the first support frame SF1 and the second support frame SF2 may increase. Thus, the support frame SF may be expanded in the first direction DR1.

When the angle θ defined by the first support frame SF1 and the third support frame SF3 is minimized, the gap between the first support frame SF1 and the second support frame SF2 may be set to be minimized. When the angle θ defined by the first support frame SF1 and the third support frame SF3 is maximized, the gap between the first support frame SF1 and the second support frame SF2 may be set to be maximized.

A first virtual line IL1 extending parallel to the first direction DR1 from a portion of the first support frame SF1, to which one end of the third support frame SF3 is connected, may be defined. A length of the first opening OP1 may be less than a distance DT between a portion of the second support frame SF2, which crosses the first virtual line ILL and the one side OS2 of the second support frame SF2.

Referring to FIGS. 10, 11, and 12, the second case CS2 may include a first outer sidewall OSW1, a second outer sidewall OSW2, a third outer sidewall OSW3, a second bottom part BP2, and a cover part COV. The first outer sidewall OSW1 and the second outer sidewall OSW2 may extend in the first direction DR1. The second outer sidewall OSW2 may face the first outer sidewall OSW1 in the second direction DR2. The first outer sidewall OSW1 and the second outer sidewall OSW2 may have substantially the same shape as each other.

The second case CS2 may include a second protrusion PRT2 protruding from each of an inner side surface of the first outer sidewall OSW1 and an inner side surface of the second outer sidewall OSW2, which face each other, to extend in the first direction DR1. The second protrusion PRT2 may extend in the first direction DR1 from one side of each of the first and second outer sidewalls OSW1 and OSW2.

Although the second protrusion PRT2 disposed on the inner side surface of the first outer sidewall OSW1 is illustrated in the perspective view of FIG. 10, substantially, the second protrusion PRT2 may also be disposed on the inner side surface of the second outer sidewall OSW2.

The second protrusion PRT2 may be disposed at a position corresponding to the second guide groove GG2. Substantially, the second protrusion PRT2 may be inserted into the second guide groove GG2, and this configuration will be described in detail below.

One side of each of the first and second outer sidewalls OSW1 and OSW2 may be substantially defined as an end of each of first and second outer sidewalls OSW1 and OSW2 adjacent to the third sidewall SW3 when the first and second cases CS1 and CS2 are coupled to each other. Hereinafter, opposite sides of the first and second outer sidewalls OSW1 and OSW2 are defined as the other sides of the first and second outer sidewalls OSW1 and OSW2.

The third outer sidewall OSW3 may extend in the second direction DR2 and may be disposed between the other side of the first outer sidewall OSW1 and the other side of the second outer sidewall OSW2. When the first and second cases CS1 and CS2 are coupled to each other, the third outer sidewall OSW3 may face the third sidewall SW3.

An outer surface of the third outer sidewall OSW3 may have a curved shape that is convex toward the outside. An inner surface of the third sidewall SW3, which is opposite to the outer surface of the third outer sidewall OSW3, may have a concavely curved shape. When the first and second cases CS1 and CS2 are coupled to each other, the inner surface of the third outer sidewall OSW3 may face the inner surface of the third sidewall SW3.

The second bottom part BP2 may have a plane defined by the first and second directions DR1 and DR2. The second bottom part BP2 may extend from a lower end of the first outer sidewall OSW1, a lower end of the second outer sidewall OSW2, and a lower end of the third outer sidewall OSW3.

The cover part COV may be connected to an upper end of the first outer sidewall OSW1, an upper end of the second outer sidewall OSW2, and an upper end of the third outer sidewall OSW3. The cover part COV may extend along the upper end of the first outer sidewall OSW1, the upper end of the second outer sidewall OSW2, and the upper end of the third outer sidewall OSW3. The cover part COV connected to the first outer sidewall OSW1 and the second outer sidewall OSW2 may extend in the first direction DR1, and the cover part COV connected to the third outer sidewall OSW3 may extend in the second direction DR2.

The second case CS2 may include a third protrusion PRT3 protruding from each of the inner side surface of the first outer sidewall OSW1 and the inner side surface of the second outer sidewall OSW2 to extend in the first direction DR1. The third protrusion PRT3 may extend from each of the other sides of the first and second outer sidewalls OSW1 and OSW2. A connection groove CG may be defined between the third protrusion PRT3 and the cover part COV.

Although the third protrusion PRT3 and the connection groove CG disposed on/in the inner side surface of the first outer sidewall OSW1 is illustrated in the perspective view of FIG. 10, substantially, the third protrusion PRT3 and the connection groove CG may also be disposed on/in the inner side surface of the second outer sidewall OSW2.

Figure 13:
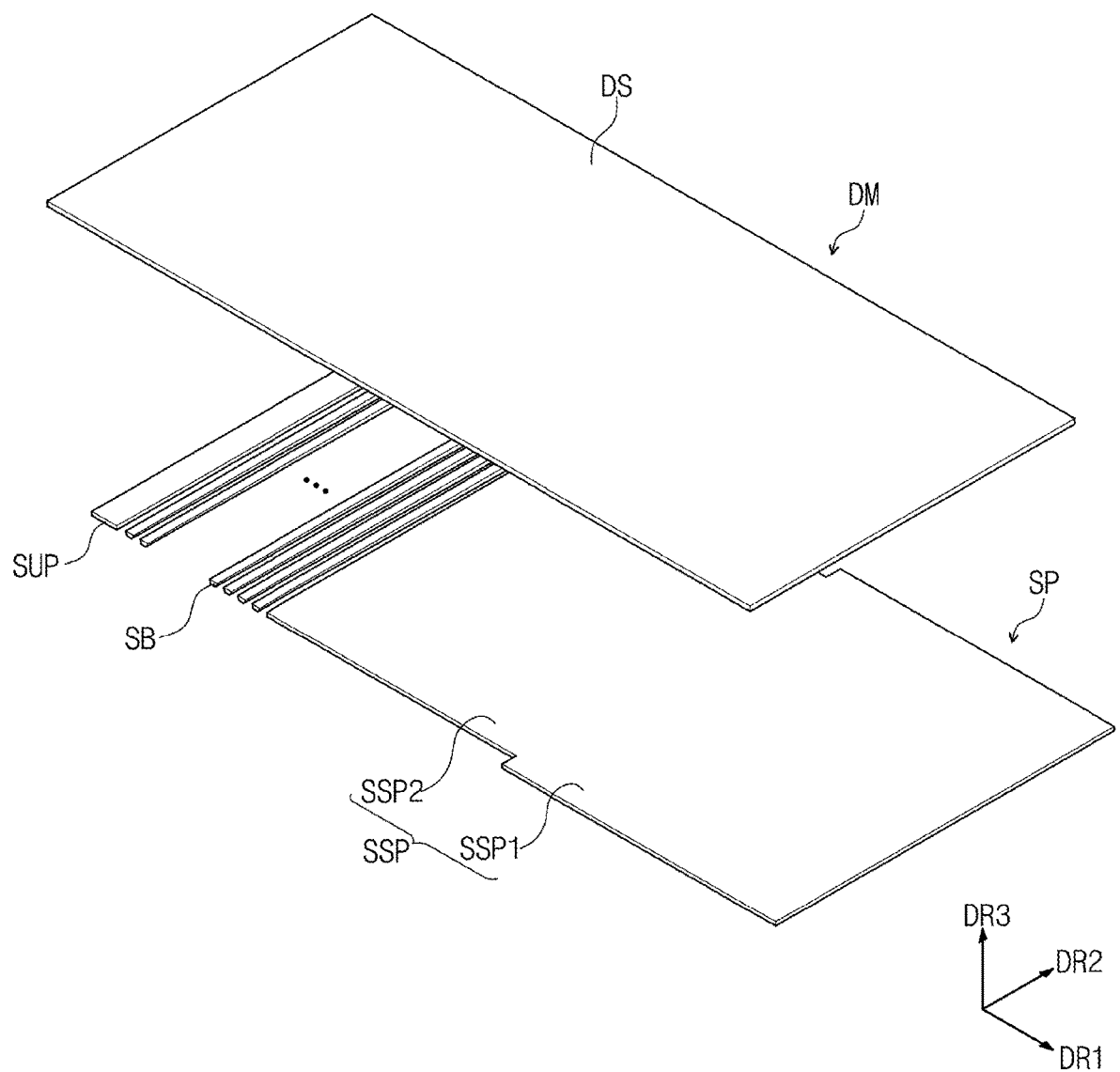
FIG. 13 is a perspective view of the display module and a support part supporting the display module, which are illustrated in FIG. 1.
Figure 14:
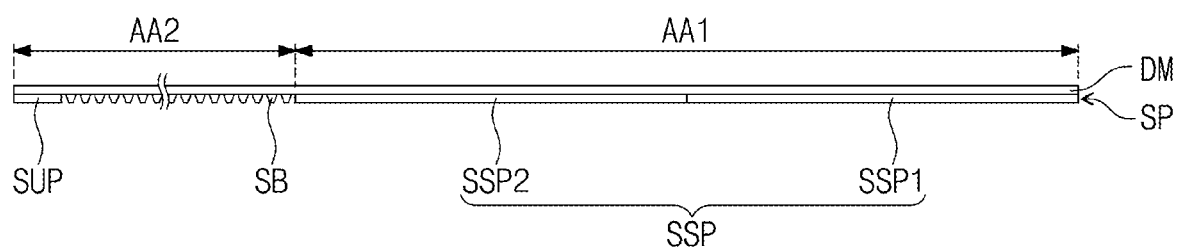
FIG. 14 is a side view of the display module and the support part, which are illustrated in FIG. 13.
Figure 14:
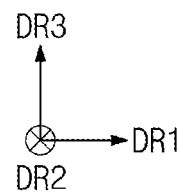

FIG. 13 is a perspective view of the display module and the support part supporting the display module, which are illustrated in FIG. 1. FIG. 14 is a side view of the display module and the support part, which are illustrated in FIG. 13.

For convenience of explanation, in FIG. 14, the display module DM and the support part SP are illustrated in a coupled state, and FIG. 14 illustrates a side view of the display module DM and the support part SP when viewed in the second direction DR2.

Referring to FIG. 13, the support part SP may be disposed under the display module DM. The support part SP may be a rigid type. The support part SP may include a support plate SSP, a plurality of support bars SB, and a sub support plate SUP. In an alternative embodiment, the sub support plate SUP may be omitted.

The support bars SB may be disposed between the support plate SSP and the sub support plate SUP. The support bars SB may extend in the second direction DR2 and be arranged in the first direction DR1. The support bars SB may be spaced apart from each other in the first direction DR1. When viewed in the second direction DR2, each of the support bars SB may have an inverted trapezoid shape.

In an embodiment, the support bars SB spaced apart from each other are illustrated, for example, but the structure of the support bars SB is not limited thereto. In an embodiment, the support bars SB may be implemented in a joint structure in which the support bars SB are rotatably coupled to each other, for example.

The support plate SSP may have a plane defined by the first and second directions DR1 and DR2. The support plate SSP may include a first support plate SSP1 and a second support plate SSP2 disposed between the first support plate SSP1 and the support bars SB. A length of the first support plate SSP1 may be greater than that of the second support plate SSP2 in the second direction DR2.

The sub support plate SUP may extend in the second direction DR2. The sub support plate SUP may have a quadrangular (e.g., rectangular) shape having long sides in the second direction DR2 and short sides in the first direction DR1.

Referring to FIG. 14, the support part SP may be disposed under the display module DM to support the display module DM. The support part SP may be disposed on a rear surface of the display module DM that is opposite to a front surface of the display module DM. The front surface of the display module DM may be defined as a display surface DS displaying an image.

Although not shown, an adhesive is disposed between the display module DM and the support part SP to attach the support part SP to the display module DM. In an embodiment, the adhesive may include a pressure sensitive adhesive, but is not limited thereto, the adhesive may include various adhesives, for example.

The display module DM may include a first area AA1 and a second area AA2. The support plate SSP may be disposed on a rear surface of the first area AA1. The support bars SB and the sub support plate SUP may be disposed on a rear surface of the second area AA2.

Figure 15:
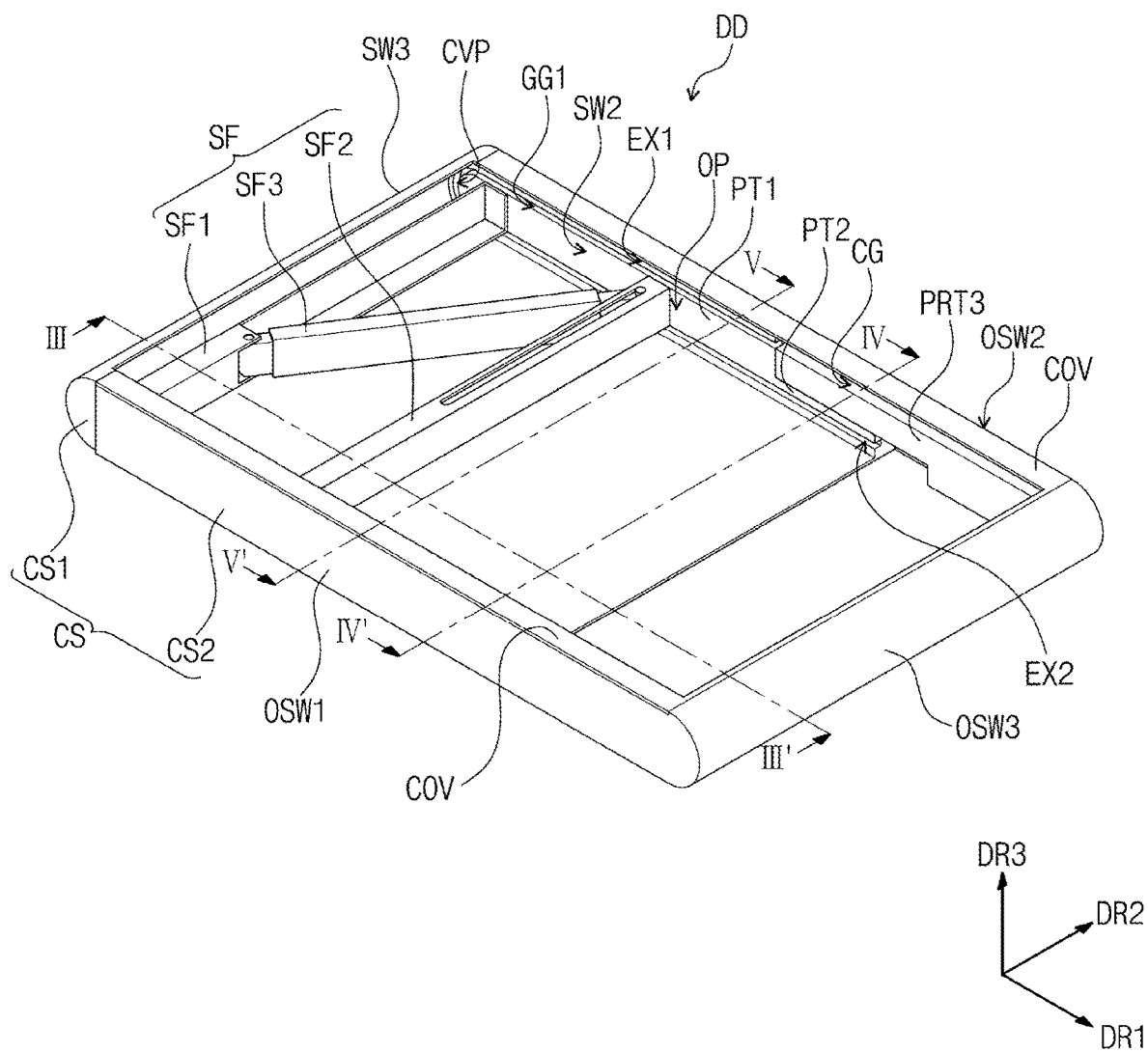
FIG. 15 is a view illustrating a coupling state of the first case, the support frame, and the second case in a normal mode of the display device illustrated in FIG. 1.
Figure 16:
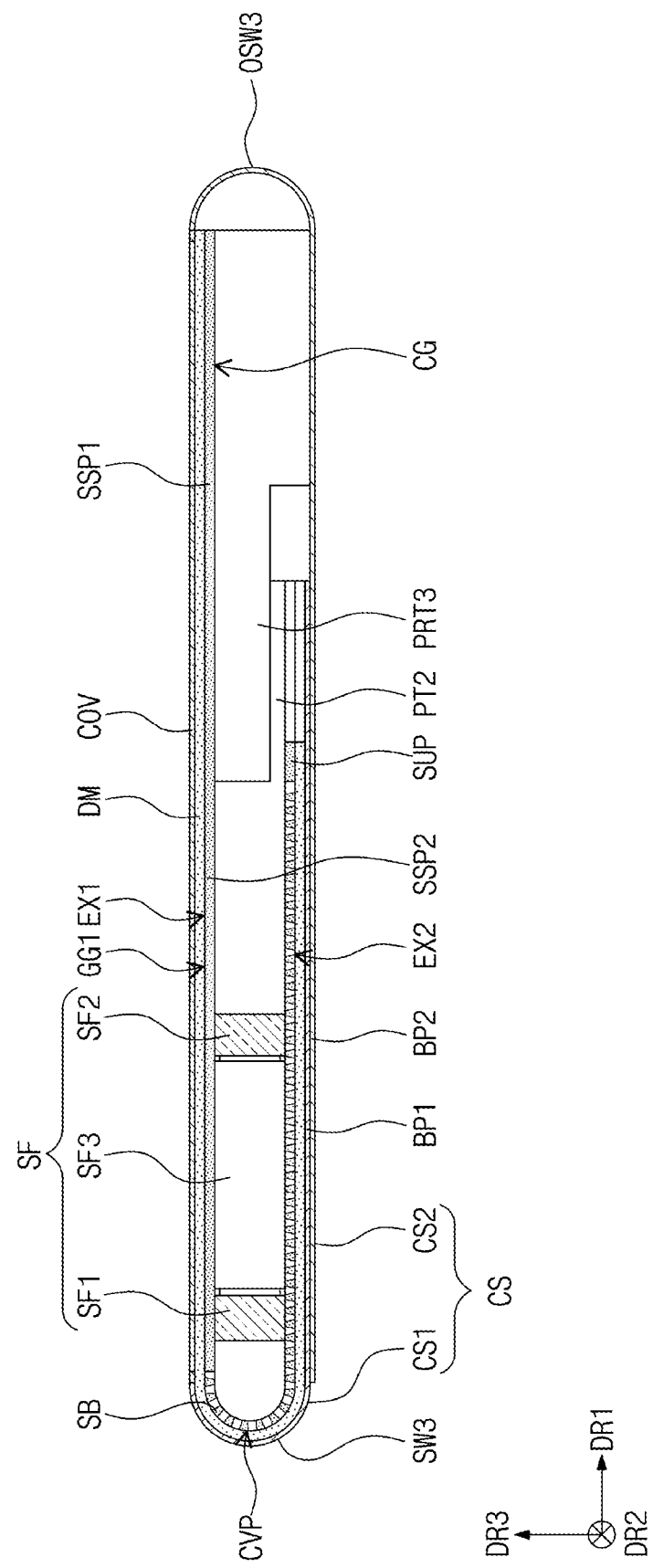
FIG. 16 is a cross-sectional view taken along line III-III' illustrated in FIG. 15.
Figure 17:
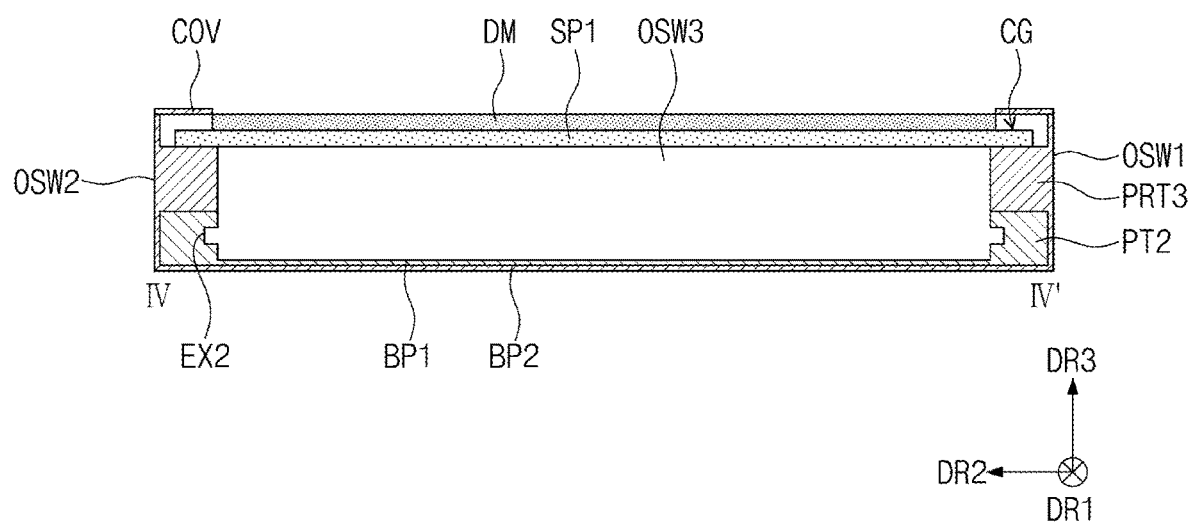
FIG. 17 is a cross-sectional view taken along line IV-IV' illustrated in FIG. 15.
Figure 18:
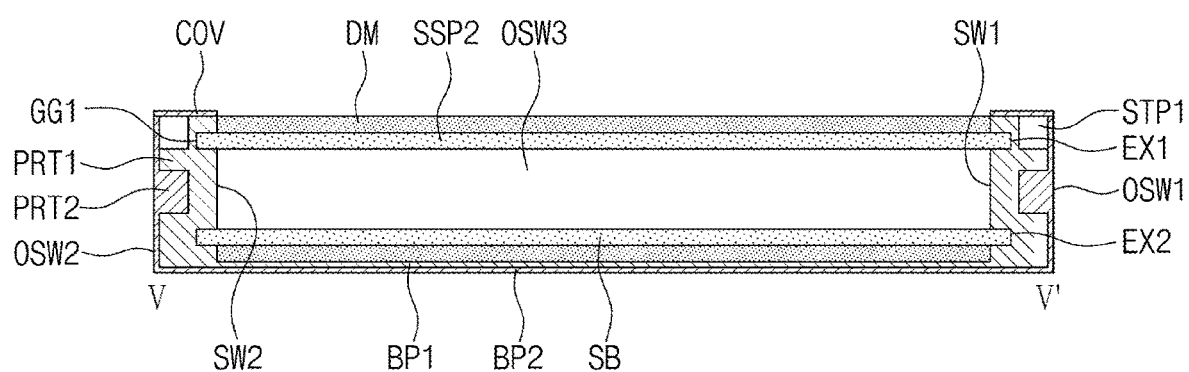
FIG. 18 is a cross-sectional view taken along line V-V' illustrated in FIG. 15.

FIG. 15 is a view illustrating a coupling state of the first case, the support frame, and the second case in a normal mode of the display device illustrated in FIG. 1. FIG. 16 is a cross-sectional view taken along line III-III' of FIG. 15. FIG. 17 is a cross-sectional view taken along line IV-IV' of FIG. 15. FIG. 18 is a cross-sectional view taken along line V-V' of FIG. 15.

For convenience of explanation, the display module DM and the support part SP are omitted in FIG. 15, and the display module DM and the support part SP are illustrated in cross-sectional views of FIGS. 16, 17, and 18.

Referring to FIG. 15, the second case CS2 may be coupled to the first case CS1. The coupled state of the first case CS1 and the second case CS2, which are illustrated in FIG. 15, may correspond to the normal mode of the display device DD illustrated in FIG. 1. In this case, the first and second outer sidewalls OSW1 and OSW2 of the second case CS2 may be disposed adjacent to the third sidewall SW3 of the first case CS1.

An opening OP may be defined between the third sidewall SW3 and the cover part COV. The third sidewall SW3 may face the third outer sidewall OSW3. The third protrusion PRT3 may be disposed on the second portion PT2. An end of the third protrusion PRT3 may face an end of the first portion PT1 and be adjacent to the end of the first portion PT1.

The state of the support frame SF may be substantially the same as that of the support frame SF illustrated in FIG. 8. In an embodiment, the other end of the third support frame SF3 may be adjacent to one side of the second support frame SF2, and a distance between the first support frame SF1 and the second support frame SF2 may be minimized, for example.

Referring to FIG. 16, the display module DM, the support plate SSP, the support bars SB, the sub support plate SUP, and the support frame SF may be accommodated in the first case CS1 and the second case CS2. The state of the display device DD illustrated in FIG. 16 may be the normal mode of the display device DD, which is implemented to move in a direction in which the second case CS2 approaches the first case CS1 along the first direction DR1.

A front surface of the display module DM may be adjacent to an edge of each of the first and second sidewalls SW1 and SW2 when viewed in the second direction DR2. The support plate SSP, the support bars SB, and the sub support plate SUP may be disposed in the connection groove CG and the first guide groove GG1 to support the display module DM.

The support plate SSP may be connected to the second case CS2. In an embodiment, the first support plate SSP1 may be disposed in the connection groove CG and connected to the second case CS2, for example. The second support plate SSP2 may be disposed on the first extension part EX1, and the support bars SB may be disposed on the curved part CVP and the second extension part EX2. The sub support plate SUP may be disposed on the second extension part EX2.

The support frame SF may be disposed under the support plate SSP and connected to the support plate SSP. In an embodiment, the support frame SF may be disposed under a portion of the support plate SSP, which is adjacent to the support bars SB and be connected to the support plate SSP, for example.

Particularly, the second support frame SF2 may be connected to a portion of the second support plate SSP2, which is adjacent to the support bars SB. Thus, as the second support plate SSP2 moves, the second support frame SF2 may move. As described above, since the first support frame SF1 is connected and fixed to the first sidewall SW1 and the second sidewall SW2, the first support frame SF1 may not move.

The second support frame SF2 may be connected to the second support plate SSP2 in various manners. In an embodiment, the second support frame SF2 may be connected to the second support plate SSP2 by the adhesive, for example. Also, the second support frame SF2 may be connected to the second support plate SSP2 by a screw.

Referring to FIGS. 16 and 17, both opposite sides of the first support plate SSP1 may be disposed in the connection grooves CG and connected to the first and second outer sidewalls OSW1 and OSW2, respectively. As illustrated in FIG. 16, when viewed in the second direction DR2, the connection groove CG may be disposed in the same line as the first extension part EX1 without overlapping the first extension part EX1.

The first support plate SSP1 may be connected to the first and second outer sidewalls OSW1 and OSW2 in various manners. In an embodiment, the first support plate SSP1 may be connected to the third protrusions PRT3 of the first and second outer sidewalls OSW1 and OSW2 by the screw or the adhesive, for example. The third protrusions PRT3 may be disposed on the second portions PT2, respectively. Both opposite sides of the display module DM may not be disposed in the connection grooves CG.

Referring to FIGS. 16 and 18, both opposite sides of the second support plate SSP2 and both opposite sides of the support bars SB may be disposed in the first guide grooves GG1, respectively. Although not shown in cross-section, both opposite sides of the sub support plate SUP may also be disposed in the first guide grooves GG1, respectively. The second support plate SSP2, the support bars SB, and the sub support plate SUP may move along the first guide grooves GG1.

Both opposite sides of the second support plate SSP2 may be disposed on the first extension parts EX1, respectively, and both opposite sides of the support bars SB may be disposed in the curved parts CVP and the second extension parts EX2, respectively. Although not shown, both opposite sides of the sub support plate SUP may be disposed in the second extension parts EX2, respectively.

The display module DM may be disposed between the inner side surface of the first sidewall SW1 and the inner side surface of the second sidewall SW2. A length of the display module DM in the second direction DR2 may be less than or equal to that between the inner side surface of the first sidewall SW1 and the inner side surface of the second sidewall SW2.

The first outer sidewall OSW1 may be disposed on an outer side surface of the first sidewall SW1, which is a surface opposite to the inner side surface of the first sidewall SW1. The second outer sidewall OSW2 may be disposed on an outer side surface of the second sidewall SW2, which is a surface opposite to the inner side surface of the second sidewall SW2. The second bottom part BP2 may be disposed under the first bottom part BP1.

The second protrusions PRT2 may be disposed in the second guide grooves GG2, respectively. The second protrusions PRT2 may move along the second guide grooves GG2.

The cover part COV connected to the upper end of the first outer sidewall OSW1 may cover the upper portion of the first sidewall SW1. The cover part COV connected to the upper end of the second outer sidewall OSW2 may cover the upper portion of the second sidewall SW2.

Figure 19:
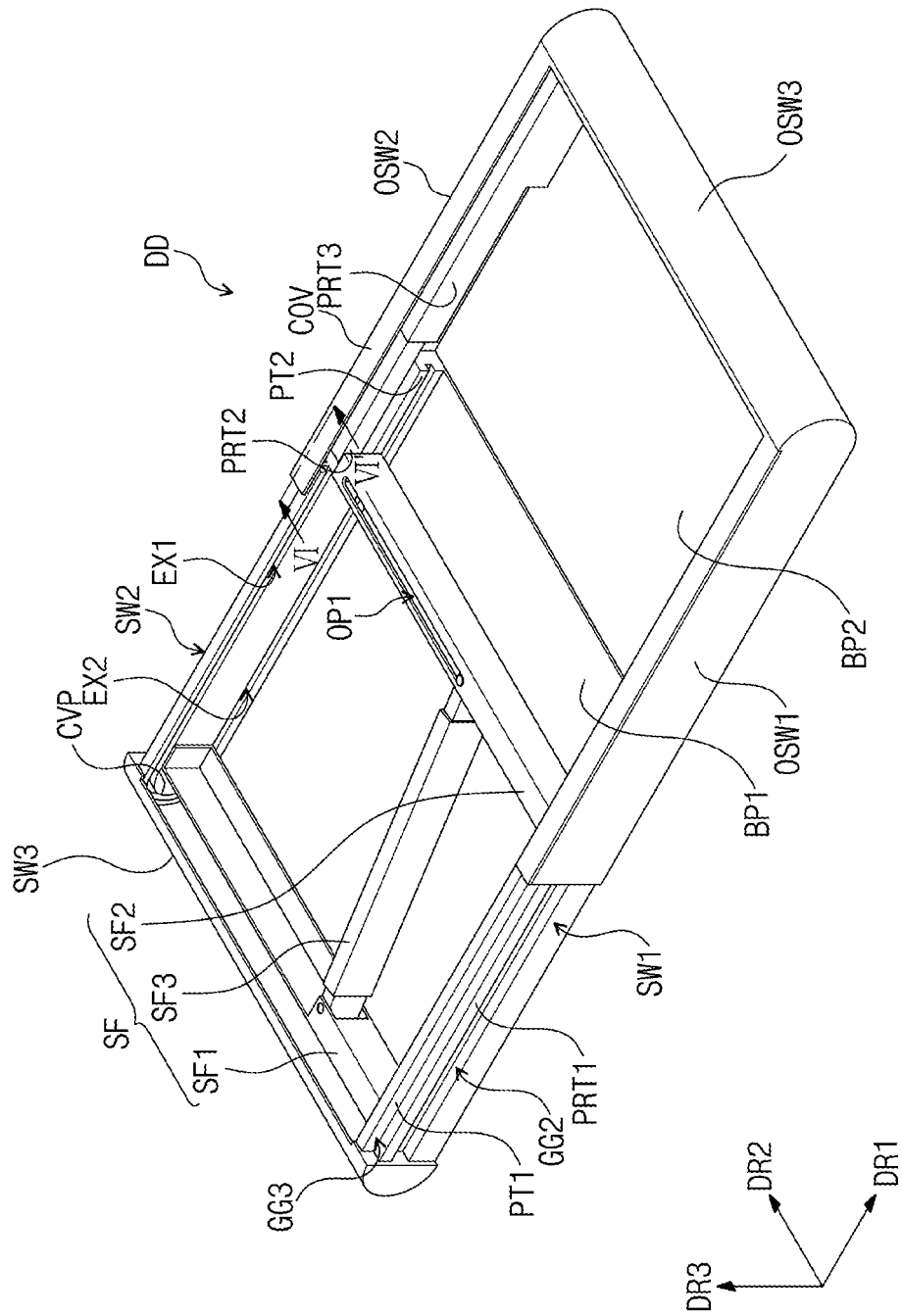
FIG. 19 is a view illustrating a coupling state of the first case, the support frame, and the second case in an expansion mode of the display device illustrated in FIG. 1.
Figure 20:
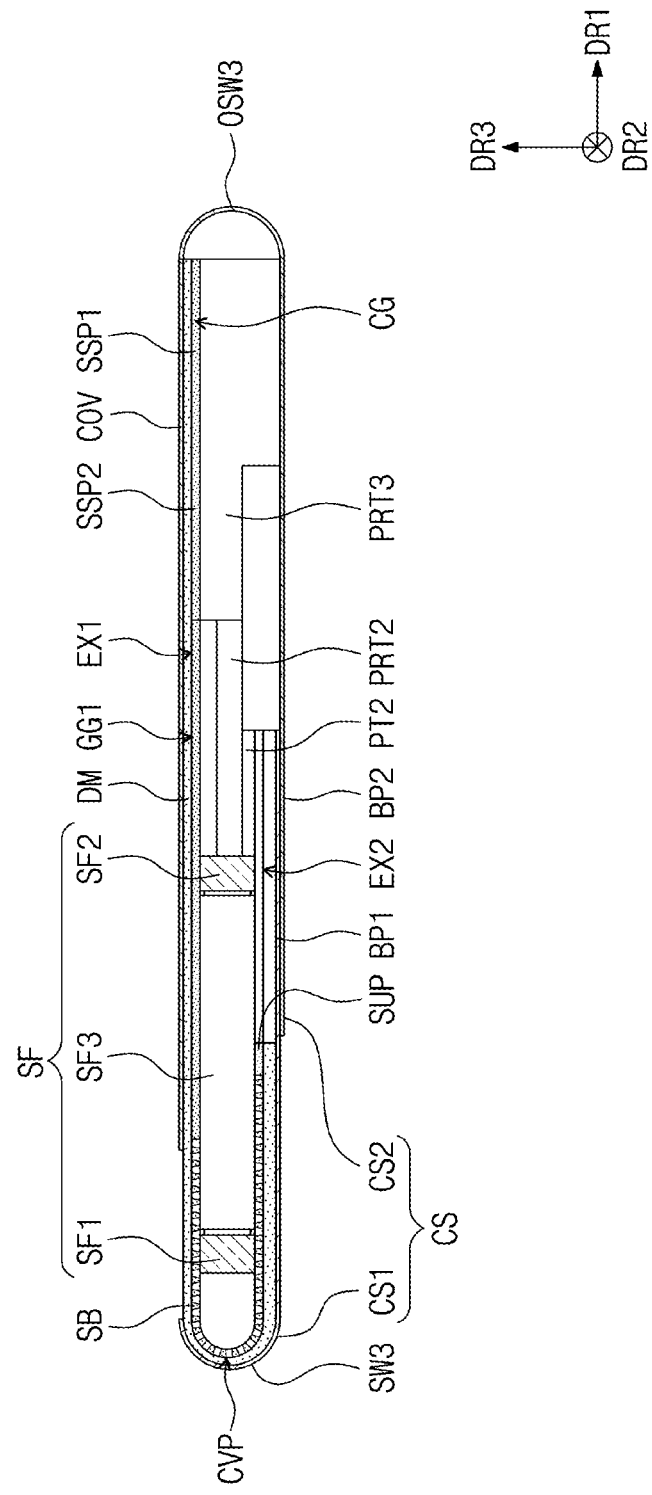
FIG. 20 is a cross-sectional view of a display device corresponding to the expansion mode of the display device illustrated in FIG. 2.

FIG. 19 is a view illustrating a coupling state of the first case, the support frame, and the second case in an expansion mode of the display device illustrated in FIG. 1. FIG. 20 is a cross-sectional view of a display device corresponding to the expansion mode of the display device illustrated in FIG. 2.

For convenience of explanation, the display module DM and the support part SP are omitted in FIG. 19, and the display module DM and the support part SP are illustrated in cross-sectional views of FIG. 20. FIG. 20 is a cross-sectional view, which substantially corresponds to FIG. 16.

Referring to FIGS. 19 and 20, when the second case CS2 moves along the first direction DR1 so as to be away from the first case CS1, the support plate SSP may move toward the outside of the first case CS1 along the second case CS2. As the second case CS2 moves, the display module DM disposed on the support part SP may also move in the first direction DR1. Thus, the exposed surface of the display module DM may be expanded to implement the extension mode illustrated in FIG. 2.

As the second case CS2 moves, the first support plate SSP1 connected to the second case CS2 may move in the first direction DR1 toward the outside of the first case CS1. The second support plate SSP2, the support bars SB, and the sub support plate SUP may move along the first guide groove GG1.

When the support bars SB move in the first direction DR1 along the support plate SSP, some of the support bars SB among the support bars SB may be disposed along the first direction DR1 at one side of the support plate SSP and also may be disposed parallelly (e.g., horizontally) together with the support plate SSP. The support frame SF may be expanded in the first direction DR1 to support the support bars SB disposed horizontally together with the support plate SSP.

Particularly, the support bars SB may move in the first direction DR1 along the support plate SSP. Some of the support bars SB adjacent to the second support plate SSP2 among the support bars SB may move to the first extension part EX1 along the curved part CVP and be disposed in a portion of the first extension part EX1.

The second support frame SF2 connected to the second support plate SSP2 may move in the first direction DR1. The state of the support frame SF may be substantially the same as that of the support frame SF illustrated in FIG. 9. In an embodiment, the other end of the third support frame SF3 may move to be away from one side of the second support frame SF2 along the first opening OP1, and the distance between the first support frame SF1 and the second support frame SF2 may be maximized, for example.

The support frame SF may be expanded in the first direction DR1 and be disposed under some of the support bars SB, which are adjacent to the support plate SSP. In an embodiment, the support frame SF may be expanded in the first direction DR1 and be disposed under the support bars SB disposed in the portion of the first extension part EX1, for example.

The support bars SB disposed in the portion of the first extension part EX1 may be adjacent to the second support plate SSP2. Particularly, the first support frame SF1 and the third support frame SF3 may be disposed under the support bars SB that are horizontally disposed together with the second support plate SSP2 at the portion of the first extension part EX1.

The first support frame SF1 and the third support frame SF3 may support the support bars SB disposed in the portion of the first extension part EX1. In an embodiment, upper portions of the first and third support frames SF1 and SF3 may be in contact with lower portions of the support bars SB disposed in the portion of the first extension part EX1, for example.

In the expansion mode, the support bars SB disposed in the portion of the first extension part EX1 may droop downward between the first sidewall SW1 and the second sidewall SW2 by external force and thus be deformed. When the support bars SB are deformed, the display module DM may not be normally supported by the support bars SB.

However, in an embodiment of the invention, in the expansion mode, the support frame SF may be expanded in the first direction DR1 to support the support bars SB disposed in the portion of the first extension part EX1. Since the first and third support frames SF1 and SF3 support the support bars SB, the deformation of the support bars SB due to the external force may be prevented.

As a result, the display device DD in an embodiment of the invention may prevent the support bars SB from being deformed.

FIGS. 21 to 28 are views illustrating the support frames according to other embodiments of the invention.

Hereinafter, configurations of support frames SF_1, SF_2, SF_3, and SF_4 illustrated in FIGS. 21 to 28, are different from the configurations of the support frame SF illustrated in FIGS. 8 and 9 will be described mainly. The configurations in which the support frames SF_1, SF_2, SF_3, and SF_4 are disposed in first and second cases CS1 and CS2 may be substantially the same as those of FIGS. 15 and 19. Therefore, for convenience of description, in FIGS. 21 to 28, the first and second cases CS1 and CS2 are not illustrated, and only the support frames SF_1, SF_2, SF_3, and SF_4 are illustrated.

Figure 21:
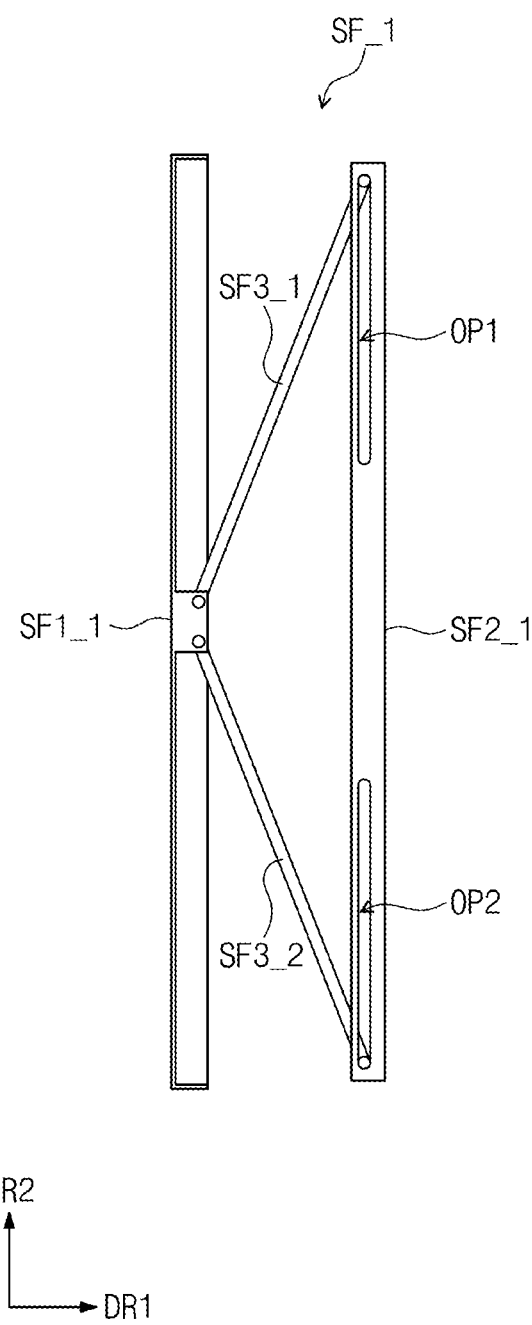
FIGS. 21 to 28 are views illustrating support frames according to other embodiments of the invention.
Figure 22:
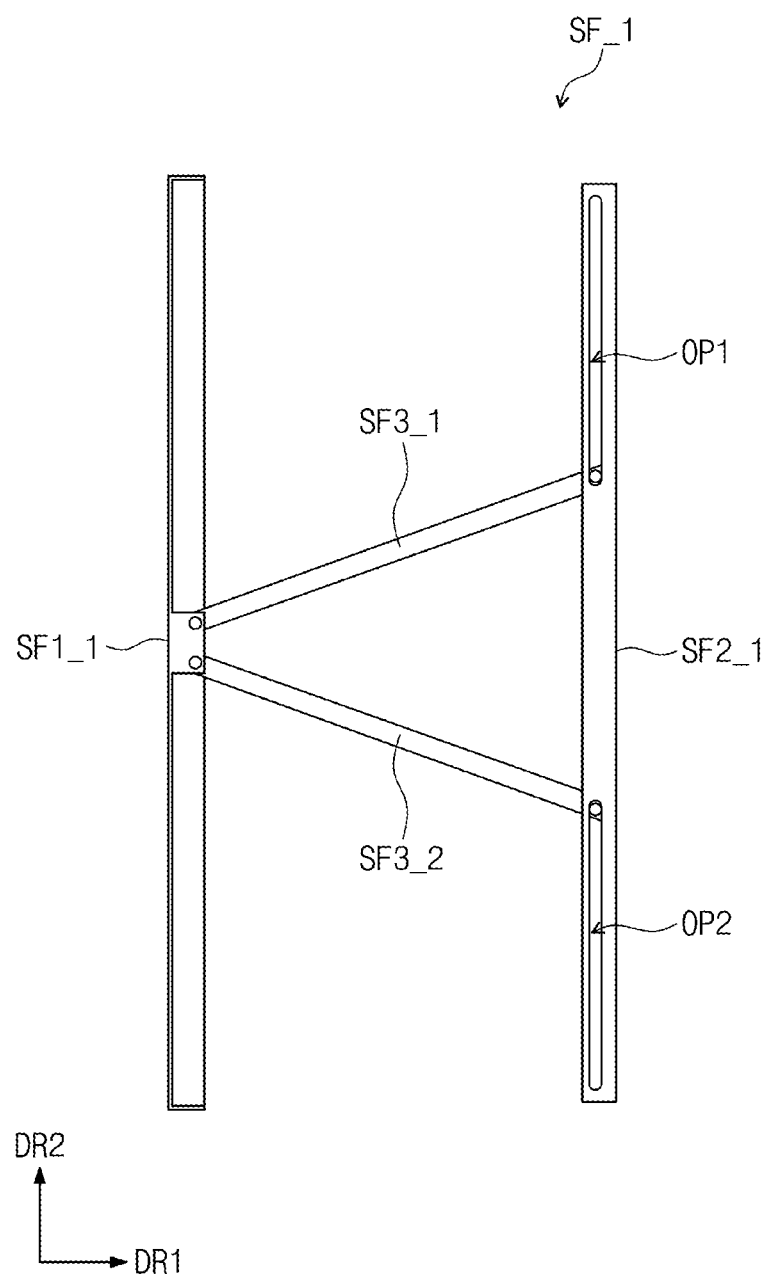

Referring to FIGS. 21 and 22, a support frame SF_1 may include a first support frame SF1_1, a second support frame SF2_1, a third support frame SF3_1, and a fourth support frame SF3_2. The first support frame SF1_1 may extend in the second direction DR2 and be connected to the first case CS1, and the second support frame SF2_2 may extend in the second direction DR2 and be connected to a support plate SSP.

The third and fourth support frames SF3_1 and SF3_2 may be disposed between the first support frame SF1_1 and the second support frame SF2_1. One end of the third support frame SF3_1 and one end of the fourth support frame SF3_2 may be rotatably connected to predetermined portions of the first support frame SF1_1, respectively.

A first opening OP1 and a second opening OP2, which are spaced apart from each other in the second direction DR2 to extend in the second direction DR2, may be defined in the second support frame SF2_1. The other end of the third support frame SF3_1 and the other end of the fourth support frame SF3_2 may be inserted into the first opening OP1 and the second opening OP2, respectively, to move in opposite directions along the first opening OP1 and the second opening OP2.

As illustrated in FIG. 22, in an expansion mode of a display device DD, the support frame SF_1 may be expanded in the first direction DR1, and support bars SB disposed in a first extension part EX1 may be supported by the second, third, and fourth support frames SF2_1, SF3_1, and SF3_2.

Figure 23:
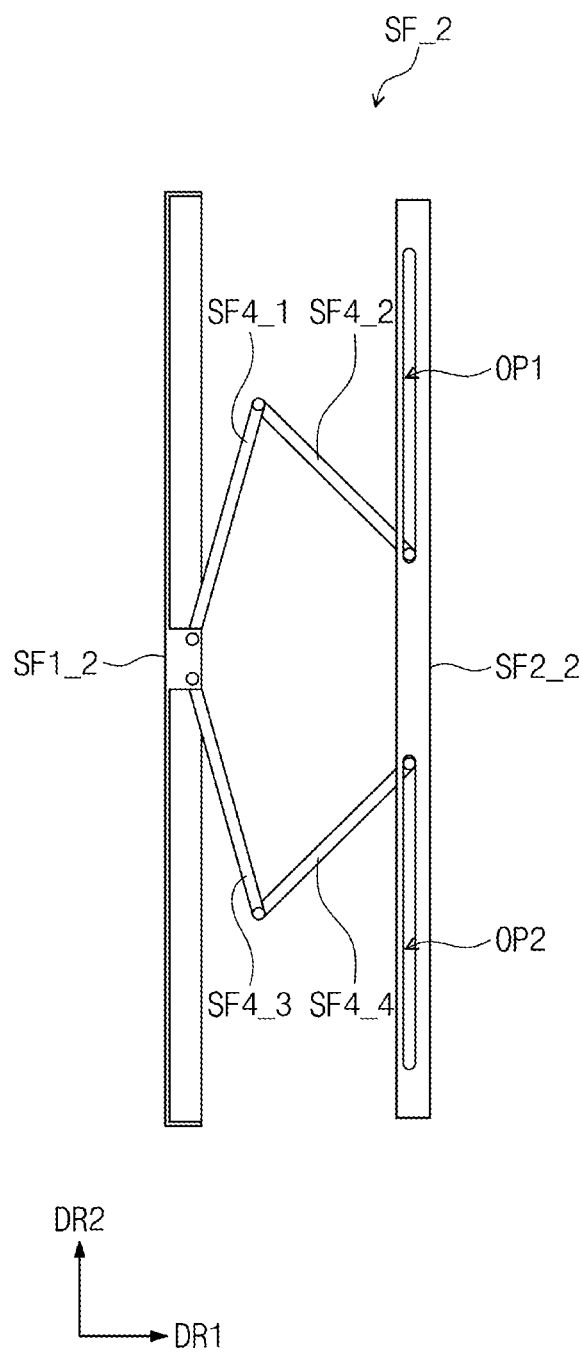
Figure 24:
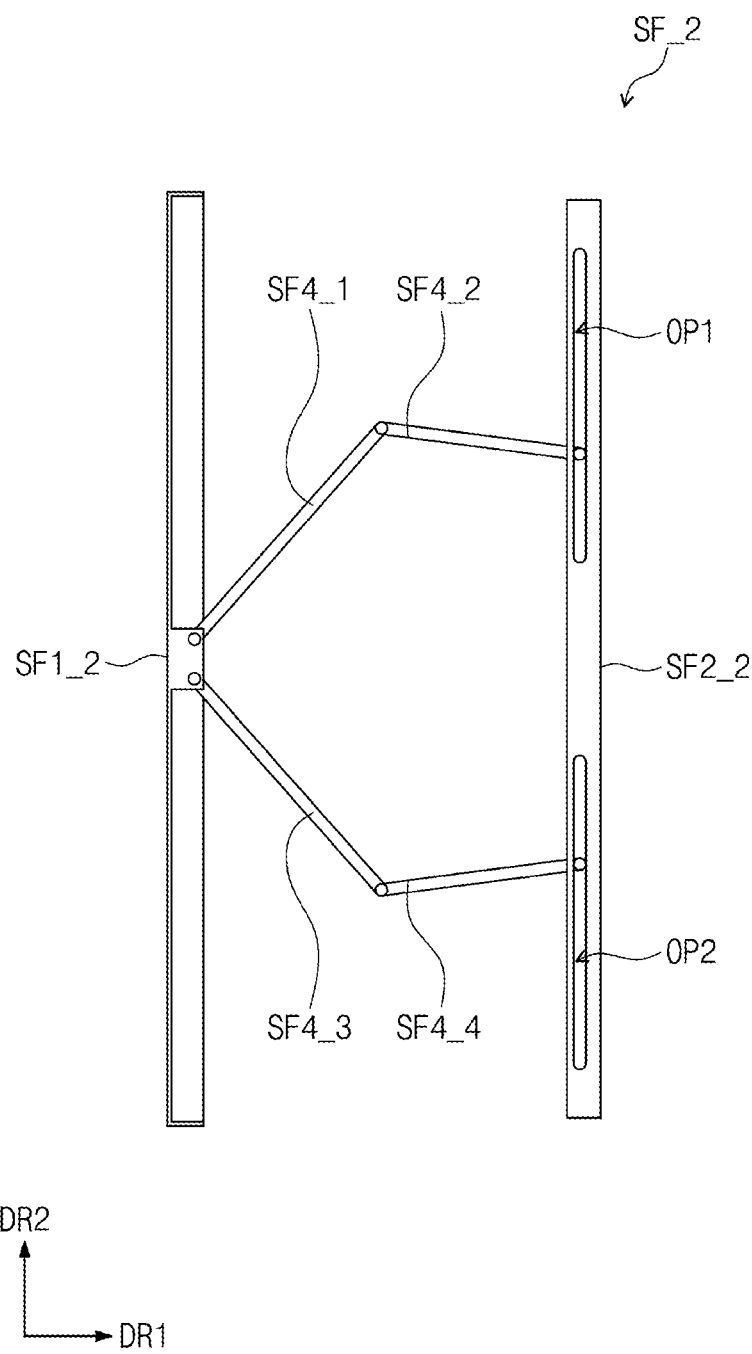

Referring to FIGS. 23 and 24, the support frame SF_2 may include a first support frame SF1_2, a second support frame SF2_2, a third support frame SF4_1, a fourth support frame SF4_2, a fifth support frame SF4_3, and a sixth support frame SF4_4. The first support frame SF1_2 may extend in the second direction DR2 and be connected to the first case CS1, and the second support frame SF2_2 may extend in the second direction DR2 and be connected to the support plate SSP.

The third, fourth, fifth, and sixth support frames SF4_1, SF4_2, SF4_3, and SF4_4 may be disposed between the first support frame SF1_2 and the second support frame SF2_2. First and second openings OP1 and OP2, which are spaced apart from each other in the second direction DR2 to extend in the second direction DR2, may be defined in the second support frame SF2_2.

One end of the third support frame SF4_1 may be rotatably connected to a portion of the first support frame SF1_2, and the other end of the third support frame SF4_1 may be rotatably connected to one end of the fourth support frame SF4_2. The other end of the fourth support frame SF4_2 may be inserted into the first opening OP1 to move along the first opening OP1.

One end of the fifth support frame SF4_3 may be rotatably connected to the other portion of the first support frame SF1_2, and the other end of the fifth support frame SF4_3 may be rotatably connected to one end of the sixth support frame SF4_4. The other end of the sixth support frame SF4_4 may be inserted into the second opening OP2 to move along the second opening OP2.

As illustrated in FIG. 24, in the expansion mode of the display device DD, the support frame SF_2 may be expanded in the first direction DR1, and the support bars SB disposed in the first extension part EX1 may be supported by the second, third, fourth, fifth, and sixth support frames SF2_2, SF4_1, SF4_2, SF4_3, and SF4_4.

Figure 25:
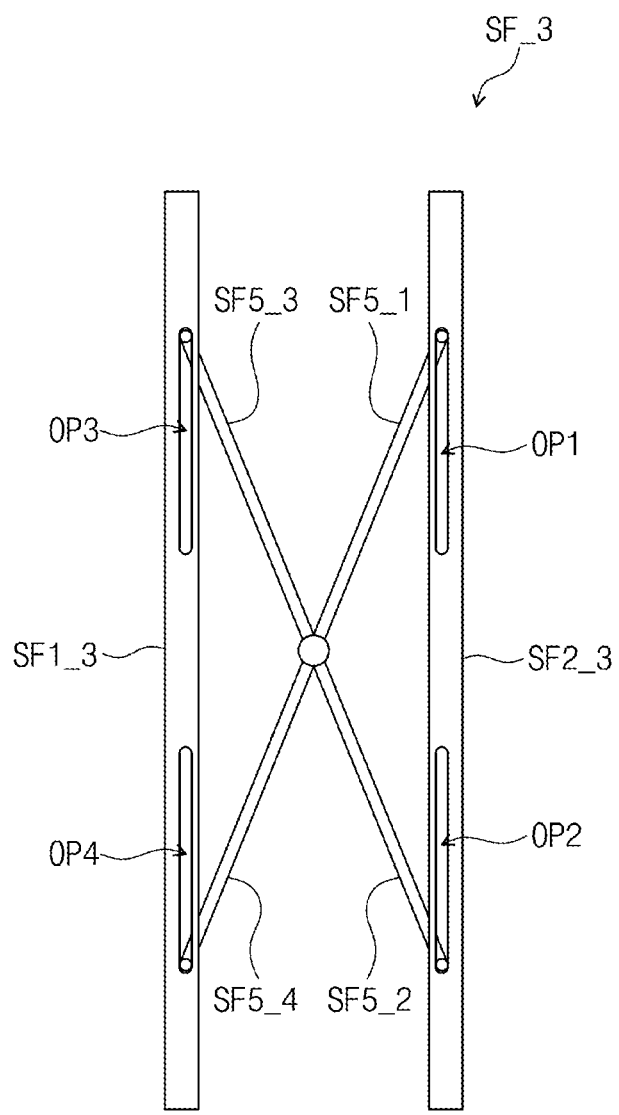
Figure 26:
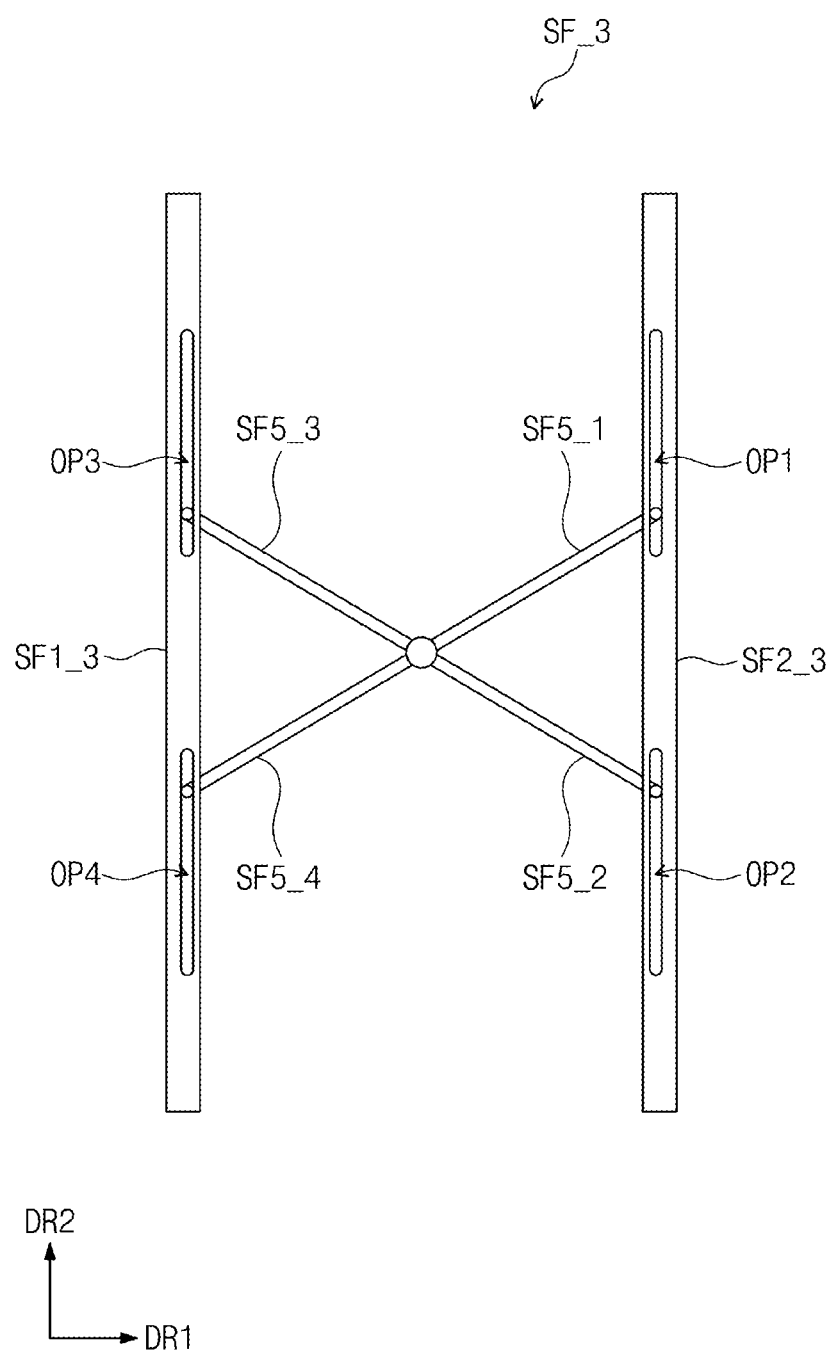

Referring to FIGS. 25 and 26, the support frame SF_3 may include a first support frame SF1_3, a second support frame SF2_3, a third support frame SF5_1, a fourth support frame SF5_2, a fifth support frame SF5_3, and a sixth support frame SF5_4. The first support frame SF1_3 may extend in the second direction DR2 and be connected to the first case CS1, and the second support frame SF2_3 may extend in the second direction DR2 and be connected to the support plate SSP.

The third, fourth, fifth, and sixth support frames SF5_1, SF5_2, SF5_3, and SF5_4 may be disposed between the first support frame SF1_3 and the second support frame SF2_3. First and second openings OP1 and OP2, which are spaced apart from each other in the second direction DR2 to extend in the second direction DR2, may be defined in the second support frame SF2_3. Third and fourth openings OP3 and OP4, which are spaced apart from each other in the second direction DR2 to extend in the second direction DR2, may be defined in the first support frame SF1_3.

One end of the third support frame SF5_1, one end of the fourth support frame SF5_2, one end of the fifth support frame SF5_3, and one end of the sixth support frame SF5_4 may be rotatably connected to each other.

The other end of the third support frame SF5_1 may be inserted into the first opening OP1 to move along the first opening OP1, and the other end of the fourth support frame SF5_2 may be inserted into the second opening OP2 to move along the second opening OP2. The other end of the fifth support frame SF5_3 may be inserted into the third opening OP3 to move along the third opening OP3, and the other end of the sixth support frame SF5_4 may be inserted into the fourth opening OP4 to move along the fourth opening OP4.

As illustrated in FIG. 26, in the expansion mode of the display device DD, the support frame SF_3 may be expanded in the first direction DR1, and the support bars SB disposed in the first extension part EX1 may be supported by the second, third, fourth, fifth, and sixth support frames SF2_3, SF5_1, SF5_2, SF5_3, and SF5_4.

Figure 27:
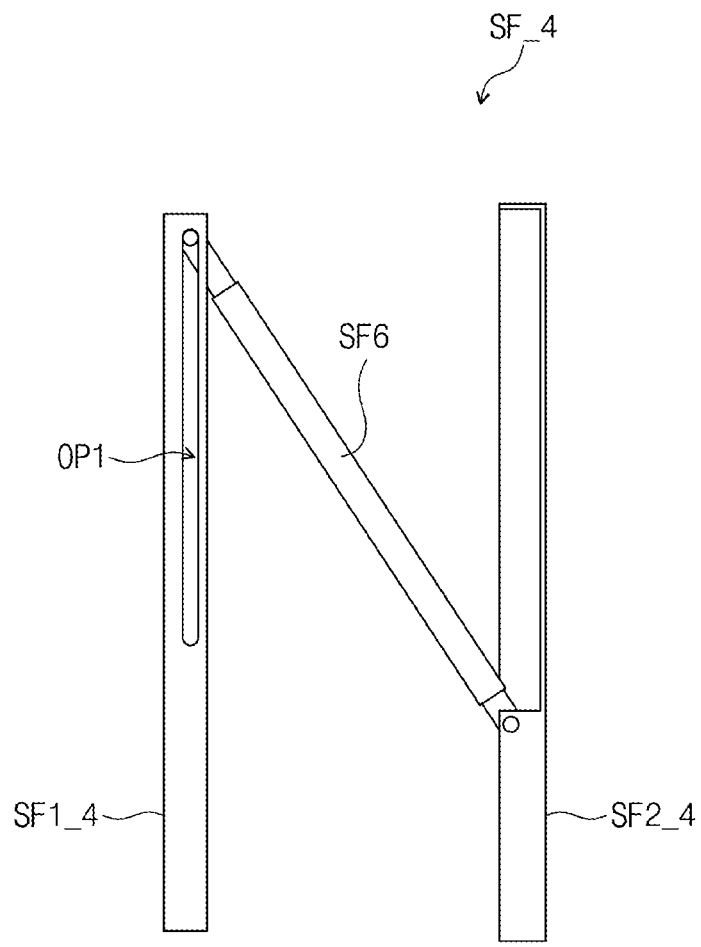
Figure 28:
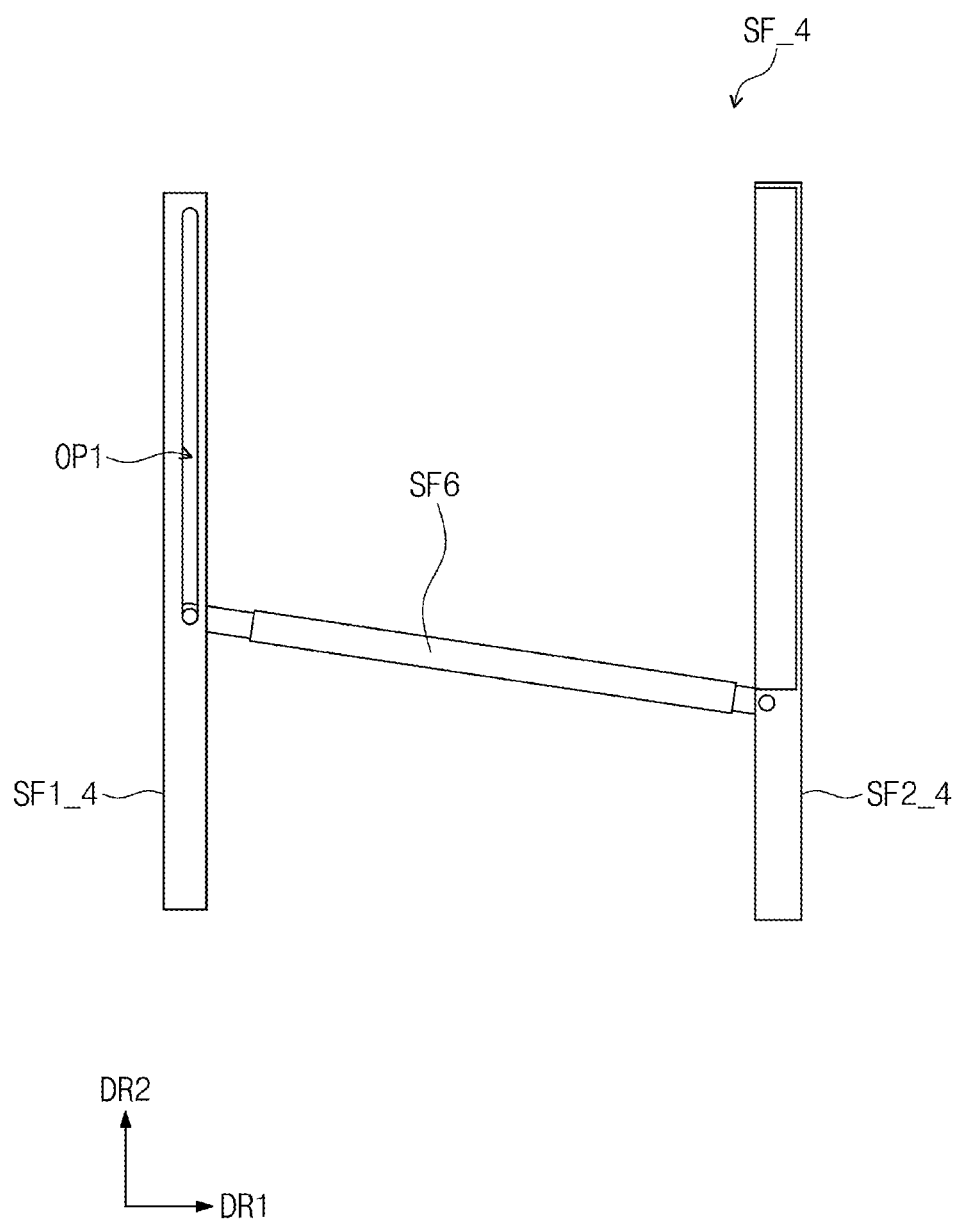

Referring to FIGS. 27 and 28, the support frame SF_4 may include a first support frame SF1_4, a second support frame SF2_4, and a third support frame SF6. The structure of the support frame SF_4 may be substantially the same as an inverse structure of the support frame SF illustrated in FIGS. 8 and 9.

In an embodiment, the first support frame SF1_4 may be substantially the same as the second support frame SF2 illustrated in FIGS. 8 and 9, and the second support frame SF2_4 may be substantially the same as the first support frame SF1 illustrated in FIGS. 8 and 9, for example. The third support frame SF6 may be substantially the same as the third support frame SF3 illustrated in FIGS. 8 and 9.

The first support frame SF1_4 may be connected to the support plate SSP, and the second support frame SF2_4 may be connected to the first case CS1. One end of the third support frame SF6 may be rotatably connected to a portion of the second support frame SF2_4. The other end of the third support frame SF6 may be inserted into the first opening OP1 defined in the first support frame SF1_4 to move along the first opening OP1.

The expansion and contraction of the flexible display module according to the needs of the user may be the technology that is capable of improving the user convenience, and the invention has high industrial applicability.

It will be apparent to those skilled in the art that various modifications and variations may be made in the invention. Thus, it is intended that the invention covers the modifications and variations of this invention provided they come within the scope of the appended claims and their equivalents. Thus, to the maximum extent allowed by law, the scope of the invention is to be determined by the broadest permissible interpretation of the following claims and their equivalents, and shall not be restricted or limited by the foregoing detailed description.

The invention claimed is:

1. A display device comprising:
a display module;
a support part disposed on a surface of the display module opposite to a display surface of the display module, the support part comprising a support plate and a plurality of support bars;
a support frame disposed under the support part and overlapping a portion of the support part;
a first case which accommodates the display module, the support part, and the support frame; and
a second case coupled to the first case such that the second case moves in a direction which is away from or closer to the first case along a first direction,
wherein, when the second case moves along the first direction away from the first case, support bars of the plurality of support bars are arranged in parallel with the support plate at one side of the support plate, and the support frame is expanded in the first direction and supports the support bars which are arranged in parallel with the support plate, and
wherein each of the plurality of support bars are independent and separate of one another and arranged in parallel and contiguous to one another.

2. The display device of claim 1, wherein the support plate is connected to the second case.

3. The display device of claim 1, wherein the support frame comprises:
a first support frame extending in a second direction crossing the first direction and connected to the first case;
a second support frame extending in the second direction, spaced apart from the first support frame in the first direction, and connected to the support plate; and
a third support frame disposed between the first support frame and the second support frame,
wherein one end of the third support frame is rotatably connected to a portion of the first support frame, and another end of the third support frame is connected to the second support frame and moves in the second direction along the second support frame.

4. The display device of claim 3, wherein the another end of the third support frame comprises a protrusion unit protruding in a third direction crossing a plane defined by the first direction and the second direction,
wherein the protrusion unit is inserted into a first opening defined in the second support frame and extending in the second direction.

5. The display device of claim 3, wherein a groove is defined from the portion of the first support frame, which is connected to the third support frame, to one side of the first support frame.

6. The display device of claim 3, wherein, when the second case moves along the first direction away from the first case, the first support frame and the third support frame are disposed under the support bars which are arranged parallelly with the support plate.

7. The display device of claim 3, wherein the third support frame defines an angle greater than 0 degree and less than 90 degrees with the first support frame.

8. The display device of claim 3, wherein a first virtual line extending parallel to the first direction from the portion of the first support frame, which is connected to the third support frame, is defined, and a length of the first opening is less than a distance between a portion of the second support frame crossing the first virtual line and one side of the second support frame.

9. The display device of claim 1, wherein the support plate comprises:
   a first support plate connected to the second case; and
   a second support plate disposed between the first support plate and the plurality of support bars,
   wherein both sides of the second support plate and both sides of the plurality of support bars are disposed in a first guide groove defined in inner side surfaces of the first case, which face each other in a second direction crossing the first direction.

10. The display device of claim 9, wherein the first guide groove comprises:
    a first extension part extending in the first direction;
    a second extension part extending in the first direction and disposed under the first extension part; and
    a curved part extending in a curved shape from one end of the first extension part to one end of the second extension part,
    wherein the one end of the first extension part and the one end of the second extension part are adjacent to the first case, and
    the both sides of the second support plate are disposed in the first extension part, and the both sides of the support bars are disposed in the curved part and the second extension part.

11. The display device of claim 10, wherein the support frame is disposed between the first extension part and the second extension part.

12. The display device of claim 10, wherein the support frame is adjacent to the curved part.

13. The display device of claim 10, wherein the support bars arranged parallelly with the support plate are disposed in the first extension part.

14. The display device of claim 13, wherein, when the second case moves along the first direction away from the first case, the support frame expands in the first direction and is disposed under the support bars disposed in the first extension part.

15. The display device of claim 10, wherein the first case comprises:
    a first sidewall extending in the first direction;
    a second sidewall extending in the first direction and facing the first sidewall in the second direction;
    a third sidewall disposed between the first sidewall and the second sidewall and defining the one side of the first case; and
    a first bottom part extending from an end of the first sidewall, an end of the second sidewall, and an end of the third sidewall such that the first bottom part has a plane defined by the first direction and the second direction,
    wherein the first guide groove is defined in each of an inner side surface of the first sidewall and an inner side surface of the second sidewall, which face each other, and the support frame is disposed between the first sidewall and the second sidewall.

16. The display device of claim 15, wherein each of the first sidewall and the second sidewall comprises a first protrusion protruding from each of an outer side surface of the first sidewall and an outer side surface of the second sidewall and extending in the first direction, and
    a second guide groove extending in the first direction is defined under the first protrusion.

17. The display device of claim 16, wherein the second case comprises:
    a first outer sidewall disposed on the outer side surface of the first sidewall;
    a second outer sidewall disposed on the outer side surface of the second sidewall;
    a third outer sidewall facing the third sidewall and disposed between the first outer sidewall and the second outer sidewall;
    a second bottom part disposed under the first bottom part; and
    a second protrusion protruding from each of an inner side surface of the first outer sidewall and an inner side surface of the second outer sidewall, which face each other and extending in the first direction,
    wherein the second protrusion is disposed in the second guide groove.

18. The display device of claim 17, wherein the second case further comprises a cover part connected to an end of the first outer sidewall and an end of the second outer sidewall and covering an portion of the first sidewall and an portion of the second sidewall.

19. The display device of claim 18, wherein the second case further comprises a third protrusion protruding from each of the inner side surface of the first outer sidewall and the inner side surface of the second outer sidewall and extending in the first direction, and
    both sides of the first support plate are disposed in a connection groove defined between the cover part and the third protrusion, and when viewed in the second direction, the connection groove does not overlap the first extension part.

20. The display device of claim 1, wherein the support frame comprises:
    a first support frame extending in a second direction crossing the first direction and connected to the first case;
    a second support frame extending in the second direction and connected to the support plate; and
    a third support frame and a fourth support frame, which are disposed between the first support frame and the second support frame,
    wherein one end of the third support frame and one end of the fourth support frame are rotatably connected to predetermined portions of the first support frame, respectively, and
    another end of the third support frame and another end of the fourth support frame are respectively inserted into a first opening and a second opening, which are defined in the second support frame and spaced apart from each other in the second direction and extend in the second direction, such that the another end of the third support frame and the another end of the fourth support frame move in opposite directions along the first opening and the second opening.

21. The display device of claim 1, wherein the support frame comprises:

a first support frame extending in a second direction crossing the first direction and connected to the first case;

a second support frame extending in the second direction and connected to the support plate; and a third support frame, a fourth support frame, a fifth support frame, and a sixth support frame, which are disposed between the first support frame and the second support frame, wherein one end of the third support frame is rotatably connected to a portion of the first support frame, and the other end of the third support frame is rotatably connected to one end of the fourth support frame, one end of the fifth support frame is rotatably connected to the other portion of the first support frame, and the other end of the fifth support frame is rotatably connected to one end of the sixth support frame, and the other end of the fourth support frame and the other end of the sixth support frame are respectively inserted into a first opening and a second opening, which are defined in the second support frame and spaced apart from each other in the second direction and extend in the second direction, such that the fourth support frame and the sixth support frame move along the first opening and the second opening.

22. The display device of claim 1, wherein the support frame comprises:

a first support frame extending in a second direction crossing the first direction and connected to the first case;

a second support frame extending in the second direction and connected to the support plate; and a third support frame, a fourth support frame, a fifth support frame, and a sixth support frame, which are disposed between the first support frame and the second support frame, wherein one end of the third support frame, one end of the fourth support frame, one end of the fifth support frame, and one end of the sixth support frame are rotatably connected to each other, another end of the third support frame and another end of the fourth support frame are respectively inserted into a first opening and a second opening, which are defined in the second support frame and spaced apart from each other in the second direction and extend in the second direction, such that the another end of the third support frame and the another end of the fourth support frame move along the first opening and the second opening, and another end of the fifth support frame and another end of the sixth support frame are respectively inserted into a third opening and a fourth opening, which are defined in the first support frame and spaced apart from each other in the second direction and extend in the second direction, such that the fifth support frame and the sixth support frame move along the third opening and the fourth opening.

23. The display device of claim 1, wherein the support frame comprises:

a first support frame extending in a second direction crossing the first direction and connected to the support plate;

a second support frame extending in the second direction and connected to the first case; and a third support frame disposed between the first support frame and the second support frame, wherein one end of the third support frame is rotatably connected to a portion of the second support frame, and another end of the third support frame is inserted into a first opening, which is defined in the first support frame and extends in the second direction, such that the another end of the third support frame moves along the first opening.

24. A display device comprising:

a display module;

a support part disposed on a surface of the display module opposite to a display surface of the display module, the support part comprising a support plate and a plurality of support bars;

a first case which accommodates the display module and the support part;

a second case coupled to move in a direction which is away from or closer to the first case along a first direction;

a first support frame disposed under the support plate, extending in a second direction crossing the first direction, and connected to the first case;

a second support frame extending in the second direction, spaced apart from the first support frame in the first direction, and connected to the support plate; and a third support frame disposed between the first support frame and the second support frame, wherein one end of the third support frame is rotatably connected to a portion of the first support frame, and another end of the third support frame is inserted into a first opening, which is defined in the second support frame and extends in the second direction, such that the another end of the third support frame moves along the first opening, and wherein each of the plurality of support bars are independent and separate of one another and arranged in parallel and contiguous to one another.

25. The display device of claim 24, wherein the support plate comprises:

a first support plate connected to the second case; and a second support plate disposed between the first support plate and the plurality of support bars, wherein the second support frame is connected to the second support plate.

26. The display device of claim 25, wherein, when the second case moves along the first direction away from the first case, support bars of the plurality of support bars are arranged parallelly with the support plate, and the first support frame and the third support frame are disposed under the support bars which are arranged parallelly with the support plate.

* * * * *